United States Patent
Bibl et al.

(10) Patent No.: US 12,009,347 B1
(45) Date of Patent: Jun. 11, 2024

(54) NANO-TETHER MICRO LED STRUCTURE

(71) Applicant: Apple Inc., Cupertino, CA (US)

(72) Inventors: Andreas Bibl, Los Altos, CA (US);
Dariusz Golda, Portola Valley, CA (US); Chae Hyuck Ahn, Campbell, CA (US); Clayton K Chan, Fremont, CA (US); Hyeun-Su Kim, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 371 days.

(21) Appl. No.: 17/345,272

(22) Filed: Jun. 11, 2021

Related U.S. Application Data

(60) Provisional application No. 63/051,124, filed on Jul. 13, 2020.

(51) Int. Cl.
*H01L 25/075* (2006.01)
*H01L 33/48* (2010.01)

(52) U.S. Cl.
CPC ........ *H01L 25/0753* (2013.01); *H01L 33/486* (2013.01); *H01L 2933/0066* (2013.01)

(58) Field of Classification Search
CPC .............. H01L 25/0753; H01L 33/486; H01L 2933/0066
See application file for complete search history.

(56) References Cited

U.S. PATENT DOCUMENTS

| | | |
|---|---|---|
| 9,105,714 B2 * | 8/2015 | Hu .......................... H01L 24/95 |
| 9,217,541 B2 | 12/2015 | Bathurst et al. |
| 10,217,730 B2 | 2/2019 | Bower et al. |
| 10,224,231 B2 | 3/2019 | Bower et al. |
| 10,244,460 B2 | 3/2019 | Wang et al. |
| 10,252,514 B2 | 4/2019 | Bower et al. |
| 10,262,966 B2 | 4/2019 | Bower |
| 10,297,502 B2 | 5/2019 | Bower et al. |
| 10,347,535 B2 | 7/2019 | Bower et al. |
| 10,361,124 B2 * | 7/2019 | Bower ............... H01L 21/6835 |
| 10,395,966 B2 | 8/2019 | Bower et al. |
| 10,396,137 B2 | 8/2019 | Cok et al. |
| 10,396,238 B2 | 8/2019 | Bower et al. |
| 10,431,487 B2 | 10/2019 | Bower et al. |
| 10,446,719 B2 | 10/2019 | Bower et al. |
| 10,468,363 B2 | 11/2019 | Prevatte et al. |
| 10,468,398 B2 | 11/2019 | Bower et al. |
| 10,522,575 B2 | 12/2019 | Bower et al. |
| 10,522,710 B2 | 12/2019 | Bower et al. |
| 2011/0151602 A1 | 6/2011 | Speier |

* cited by examiner

*Primary Examiner* — Jonathan Han
(74) *Attorney, Agent, or Firm* — Aikin & Gallant, LLP

(57) ABSTRACT

Donor substrate micro device stabilization structures and display structures are described. In an embodiment, a patterned electrically conductive layer is used to stabilize an array of micro devices on donor substrate with a plurality of tethers, which can be broken during a transfer sequence to transfer the array of micro devices from the donor substrate.

19 Claims, 25 Drawing Sheets

NANO-TETHER MICRO LED STRUCTURE

RELATED APPLICATIONS

This application claims the benefit of priority from U.S. Provisional Patent Application Ser. No. 63/051,124 filed on Jul. 13, 2020, the full disclosure of which is incorporated herein by reference.

BACKGROUND

Field

Embodiments relate to micro devices, and more particularly to the stabilization of micro devices on a carrier substrate.

Background Information

Integration and packaging issues are one of the main obstacles for the commercialization of micro devices such as radio frequency (RF) microelectromechanical systems (MEMS) microswitches, light-emitting diode (LED) display systems, and MEMS or quartz-based oscillators.

Traditional technologies for transferring devices include, e.g., "transfer printing", which involves using a transfer wafer to pick up an array of devices from a donor wafer. The array of devices are then bonded to a receiving wafer before removing the transfer wafer. In such processes the entire transfer wafer with the array of devices is involved in the transfer process.

More recently it has been proposed to transfer a semiconductor die from a host substrate to a target substrate using elastomeric stamps in which a stamp surface adheres to a semiconductor die surface via van der Waals forces. It has been separately proposed to transfer micro devices from a donor substrate to a target receiving substrate using an array of electrostatic transfer heads. In such processes, separate transfer heads can be utilized to transfer discrete micro devices. In one implementation, it has been proposed in U.S. Pat. No. 8,835,940 to stage an array of micro LEDs on an array of stabilization posts formed of an adhesive bonding material, such as a thermoset material. During the transfer process, it is described that the electrostatic transfer heads generate a sufficient pressure to overcome the adhesion strength between the adhesive bonding material and the micro LEDs and pick up the micro LEDs.

SUMMARY

Donor substrate micro device stabilization structures and display structures are described. In an embodiment, a stabilization structure includes a stabilization layer including an array of anchors that define an array of staging cavities, a corresponding array of micro devices suspended over the array of staging cavities, and a patterned electrically conductive layer spanning across the array of micro devices and the array of anchors to suspend the array of micro devices over the array of staging cavities. For example, the micro devices may be micro LEDs. The patterned electrically conductive layer can include an array of contact pads and an array of tethers, where each micro device includes at least one contact pad of the array of contact pads. In an embodiment, the patterned electrically conductive layer is a metallic layer.

A transfer head assembly including an array of micro device transfer heads can be used to transfer the array of micro devices to a receiving substrate, such as a display substrate. The array of transfer heads can apply energy to the array of micro devices during a transfer sequence to break the tethers, freeing the micro devices from the donor substrate. For example, this can include mechanical energy (pressure), thermal energy (heat), or electrical energy (electrical current) or combinations thereof. The micro devices can then be transferred to the receiving substrate. In an embodiment, a display structure includes a display substrate, a landing pad, and a micro LED mounted on the landing pad. The micro LED can include a p-n diode and a patterned electrically conductive layer that includes a contact pad and a plurality of tethers. In an embodiment, each tether can include an internal region and a terminal region adjacent a terminal end of the tether. The terminal region may have a characteristic deformation due to being placed in tension by a corresponding transfer head, leading to breaking of the tether at a deterministic location along a length of the tether. In an embodiment, such a characteristic deformation may be an increased grain boundary dislocation density compared to the internal region. In an embodiment, the tethers are broken by breaking an interface between bi-material layers forming the array of tethers. In such an embodiment, the terminal region can include an intermetallic compound along a top, bottom, or lateral surface of the patterned electrically conductive layer.

DETAILED DESCRIPTION

Figure 1A:
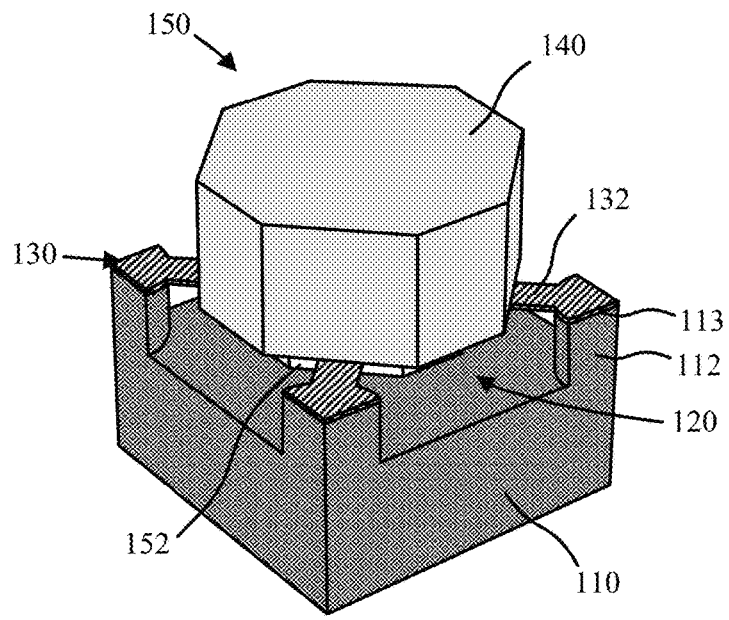
FIG. 1A is a schematic isometric view illustration of an LED stabilization structure in accordance with an embodiment.

Embodiments describe stabilization structures for the transfer of arrays of micro devices from a donor substrate to a receiving substrate. In an embodiment, a stabilization structure includes a stabilization layer including an array of anchors that define an array of staging cavities, a corresponding array of micro devices suspended over the array of staging cavities, and a patterned electrically conductive layer spanning across the array of micro devices and the array of anchors to suspend the array of micro devices over the array of staging cavities. In particular, the patterned electrically conductive layer can form mechanical tethers to the anchors as well as contact pads, or electrodes, for the micro devices.

In one aspect, embodiments describe stabilization structures in which retention strength is dependent upon mechanical properties of the tethers and anchors as opposed to surface chemistry and interface properties between materials. The stabilization structures in accordance with embodiments instead may be dictated by mechanical uniformity largely determined by deposition and patterning tolerances. In some embodiments the patterned electrically conductive material may be a metallic material. Metallic materials may bend and experience some plastic deformation before fracture. Such behavior may result in less particle generation during fracture compared to brittle fracture associated with ceramic materials. As a result, particle generation during fracture, and associated defects that can result from such particle generation (e.g. misplaced micro devices, subsequent patterning problems, etc.) may be mitigated in accordance with embodiments.

Tethering the micro devices with the patterned electrically conductive material can also allow a potential to be applied to the micro devices. In one aspect, this can be used to ground the micro devices during the transfer process. In some circumstance this can reduce charge buildup within the micro devices, and also facilitate scaling of the transfer heads to smaller sizes by incorporating monopolar electrodes, which can facilitate integration of smaller micro devices. In another aspect, this may also allow for testing of the micro devices prior to the transfer sequence to detect defective micro LEDs.

While embodiments are described with specific regard to micro LED devices comprising p-n diodes, it is to be appreciated that embodiments are not so limited and that certain embodiments may also be applicable to other micro devices which are designed in such a way so as to perform in a controlled fashion a predetermined electronic function (e.g. diode, transistor, integrated circuit, display circuitry, sensor) or photonic function (LED, laser). Embodiments are also applicable to micro chips.

The terms "micro" device, "micro" mesa, "micro" chip, or "micro" LED as used herein may refer to the descriptive size of certain devices, chips, or structures in accordance with embodiments of the invention. As used herein the term "micro device" specifically includes "micro LED" and "micro chip." As used herein, the terms "micro" devices or structures are meant to refer to the scale of 1 to 300 μm. In an embodiment, a single micro device or structure has a maximum dimension, for example lateral length or width, of 1 to 300 μm, or 1 to 100 μm. In an embodiment, each micro device, micro structure, or electrostatic transfer head has a maximum dimension of 1 to 300 μm, 1 to 100 μm, or more specifically 1 to 20 μm, or 1 to 10 μm.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "above", "over", "to", "between", "spanning" and "on" as used herein may refer to a relative position of one layer with respect to other layers. One layer "above", "over", "spanning" or "on" another layer or bonded "to" or in "contact" with another layer may be directly in contact with the other layer or may have one or more intervening layers. One layer "between" layers may be directly in contact with the layers or may have one or more intervening layers.

Figure 1B:
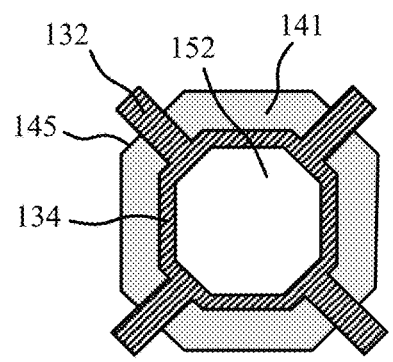
FIG. 1B is a schematic bottom view illustration of the LED of FIG. 1A in accordance with an embodiment.

FIG. 1A is a schematic isometric view illustration of an LED stabilization structure in accordance with an embodiment. FIG. 1B is a schematic bottom view illustration of the micro LED of FIG. 1A in accordance with an embodiment. In particular, the stabilization structures of FIGS. 1A-1B are close-up illustrations for the stabilization structure for a single micro LED 150. However, it is to be appreciated that the stabilization structure is a repeating array across a donor substrate.

As shown, the stabilization structure includes a stabilization layer 110 including an array of anchors 112 that define an array of staging cavities 120. In the particular embodiment illustrated in FIG. 1A the anchors 112 are staging bollards, though the anchors may adopt different configurations, such as walls that completely surround the staging cavities 120, etc. such that the anchors 112 can support a patterned electrically conductive layer 130. In accordance with embodiments, an array of micro devices (e.g. micro LEDs 150) is suspended over the array of staging cavities 120 with the patterned electrically conductive layer 130, which spans across the array of micro devices and the array of anchors 112.

The patterned electrically conductive layer 130 may be patterned to form a variety of functions, including to make electrical contact with the micro device, and to physically suspend the micro devices over the staging cavities 120. In the particular embodiment illustrated in FIGS. 1A-1B and FIG. 2, the patterned electrically conductive layer 130 includes an array of contact pads 134 and an array of tethers 132, which can optionally extend from the corresponding contact pads 134 and extend past edges 145 of the p-n diodes 140. Furthermore, the tethers 132 may electrically connect adjacent micro devices (e.g. micro LEDs 150) to one another. Each micro device may include at least one contact pad 134. For example, a micro chip may include a plurality of contact pads 134. In the illustrated embodiment, the micro LED device 150 includes a single contact pad 134, though each micro LED device 150 could optionally include a plurality of contact pads 134.

Figure 1C:
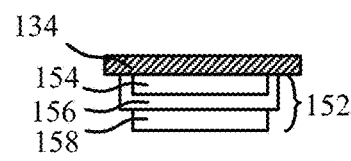
FIG. 1C is a schematic cross-sectional side view illustration of a contact pad and bottom contact in accordance with an embodiment

As shown, each micro LED 150 may include a p-n diode 140, a corresponding contact pad 134 underneath the p-n diode 140, and a bottom contact 152 coupled with the contact pad 134. The bottom contact 152 may be a metal layer stack. In the particular embodiment illustrated the patterned electrically conductive layer 130 spans along the bottom side 141 of the p-n diode, and the bottom contact 152 is formed on the contact pad 134 of the patterned electrically conductive layer 130. In an embodiment, the patterned electrically conductive layer 130 is formed of a metallic material, such as, but not limited to, Ni, NiCr, Ru, Au, Cu, Cr, Mo or Ti, conductive metal nitrides such as TiN, TaN, CrN, etc., or multi-layer stacks thereof. The contact pad 134 may have a larger area than the bottom contact 152, though this is not necessarily required. For example, the contact pad 134 can function as an ohmic contact layer and/or have a barrier function. For example, electrical contact to the bottom side 141 of the p-n diode may include a multiple layers including ohmic contact layer (e.g. Ni, NiCr, Ru, Ti), optional reflector (e.g. Al, Ag), diffusion barrier or adhesion layer (Pt, Ti, Cu, Cr, Mo), and bonding layer (e.g. Ag, Au) for bonding with a receiving substrate after a transfer process. In particular, the bottom contact 152 may function for either or both ohmic contact to the p-n diode and to prevent diffusion from other layers into the p-n diode, or ohmic contact layer. FIG. 1C is a schematic cross-sectional side view illustration of the contact pad 134 and bottom contact 152 in accordance with an embodiment, in which the contact pad 134 may provide ohmic contact, and the bottom contact 152 includes a multiple layer stack including a reflector layer 154, diffusion barrier layer 156, and bonding layer 158.

In addition to performing an electrical function, the patterned electrically conductive layer 130 can perform the physical functions of suspending the micro device over the staging cavity, and providing a break point at deterministic location along a length of the tether 132 during the micro device transfer process. Thus, physical dimensions of the tethers 132 (e.g. thickness, width) can contribute their mechanical strength, and modulus. Sizing of the micro devices, and density on the donor substrate can also be a contributing factor. In accordance with embodiments, the micro devices such as micro LEDs 150 may have a maximum width (W, lateral dimension) of less than 10 µm, such as less than 5 µm. In an exemplary implementation for illustrative purposes, the micro LEDs 150 have a maximum width of 3 µm, and are separated by a pitch (P) of less than 5 µm, such as 4 µm. This leaves a street width of 1 µm to include the anchors 112. Further area can be obtained at corners between micro LEDs 150, particularly where the micro LEDs 150 have tapered sides/corners, such as hexagon or octagon configurations. The bollard configuration in particular takes advantage of this additional space which can be slightly greater than the street width. In accordance with embodiments, the patterned electrically conductive layer 130 is formed on the top sides 113 of the anchors 112, and the tethers may have a width that is less than a maximum width of the top sides 113 of the anchors 112. In the exemplary illustration, the tethers 132 may have a width of less than 1 µm. In order to provide physical strength so suspend the micro LEDs 150, yet not be too strong or have too high of modulus a thickness of the patterned electrically conductive layer 130, and hence the tethers 132 and contact pads 134 may be less than 500 nm, such as 200 nm, 100 nm or 50 nm.

The particular arrangement of the anchors 112 and tethers 132, as well and number and dimensions of the tethers 132 can be adjusted to a particular transfer process. In the particular bollard configuration where tethers are located between corners of micro LEDs, the number of tethers may correspond to the number of bollards and have a symmetrical arrangement to mitigate tilting/tipping during the transfer process. In the illustrated embodiment, each micro LED 150 is surrounded by four bollards, and four tethers 132 span along the bottom side 141 of the p-n diode 140 and connect to corresponding bollards (anchors 112).

Figure 3:
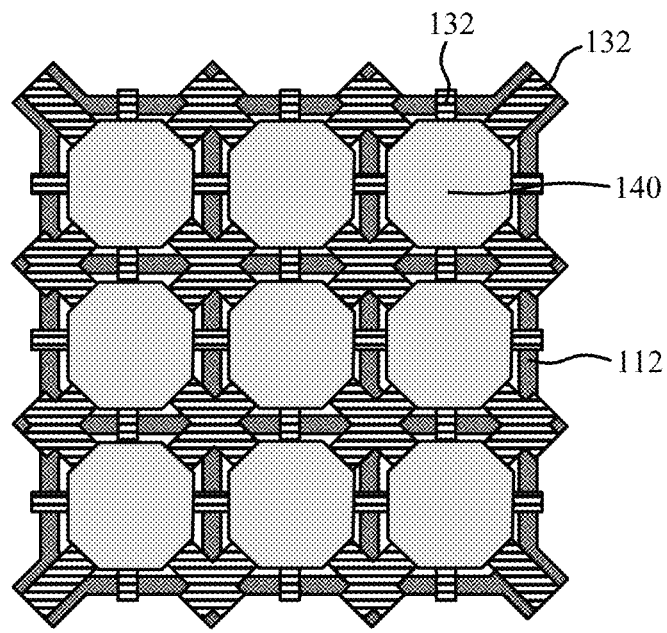
FIG. 3 is a schematic top view illustration of an array of LEDs tethered to an array of staging cavity walls in accordance with embodiment.
Figure 4:
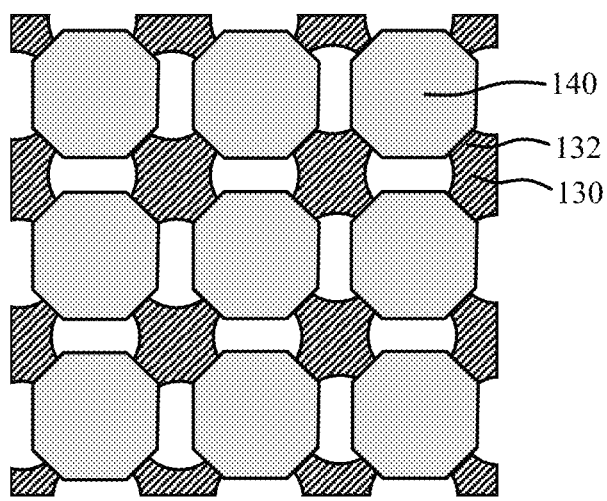
FIG. 4 is a schematic top view illustration of an array of LEDs on an electrically conductive film in accordance with embodiment.

The electrically conductive layer 130 can be patterned into a variety of shapes. FIG. 3 is a schematic top view illustration of an array of LEDs tethered to an array of anchors 112 in the shape of staging cavity walls in accordance with embodiment. Additionally, additional tethers 132 are illustrated. In some embodiments, the different tethers 132 can have different dimensions (e.g. length and width). FIG. 4 is schematic top view illustration of another configuration. In this illustration the electrically conductive layer 130 has been patterned differently so that the tethers 132 do not assume a straight arm configuration, and instead form a patterned electrically conductive film. A variety of configurations are possible.

Figure 2:
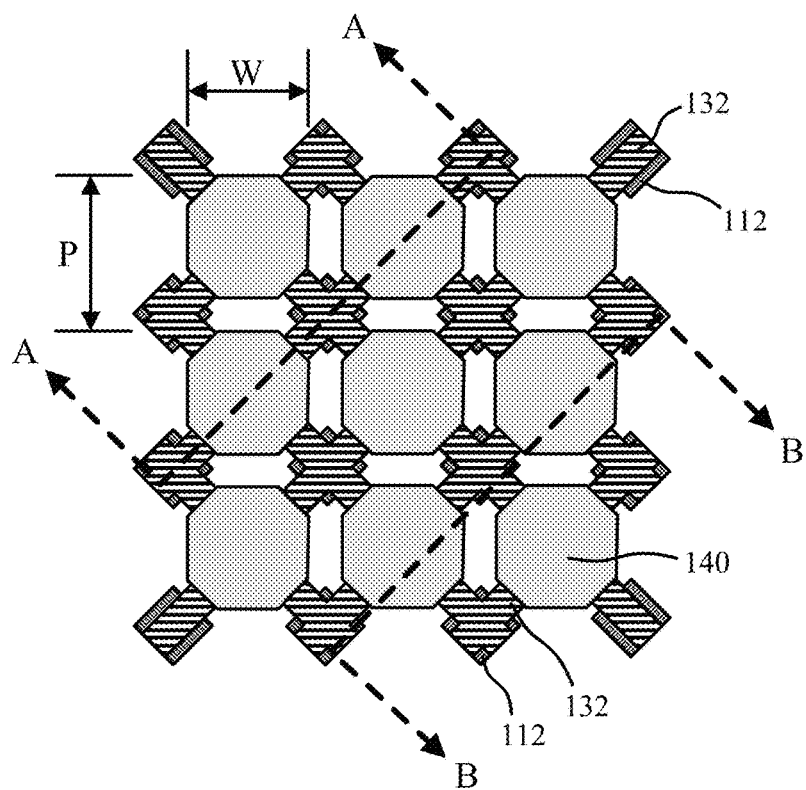
FIG. 2 is a schematic top view illustration of an array of LEDs tethered to an array of staging bollards in accordance with embodiment.
Figure 5A:
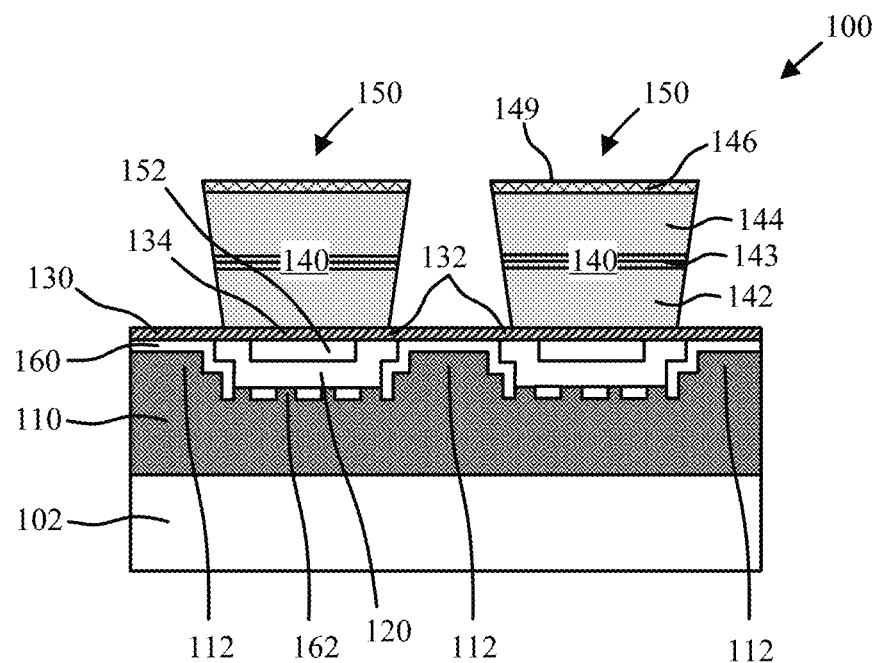
FIG. 5A is schematic cross-sectional side view illustration of a pair of LEDs taken along line A-A of FIG. 2 in accordance with an embodiment.
Figure 5B:
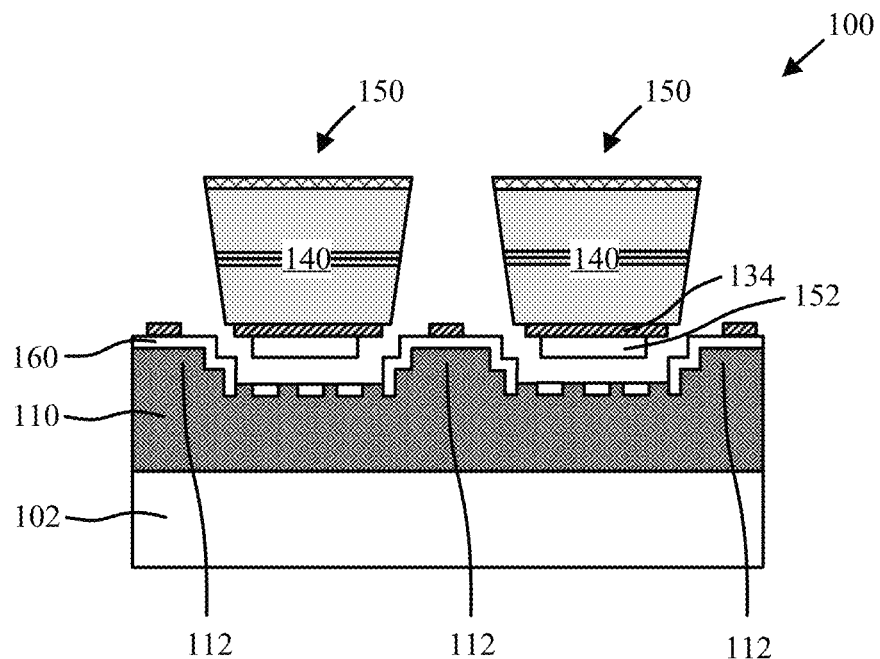
FIG. 5B is schematic cross-sectional side view illustration of a pair of LEDs taken along line B-B of FIG. 2 in accordance with an embodiment.
Figure 6:
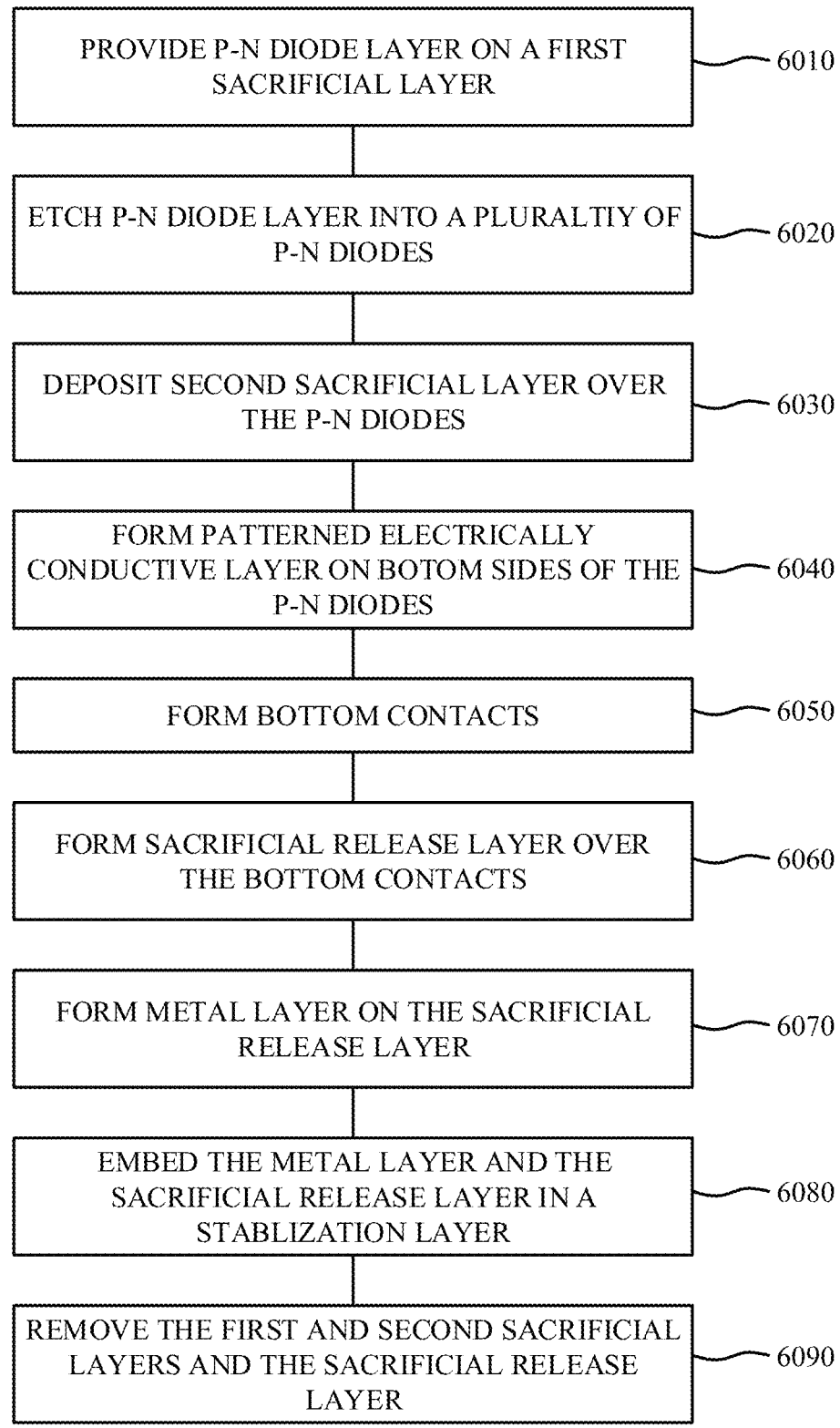
FIG. 6 is a flow chart for a method of forming an LED stabilization structure in accordance with an embodiment.

Referring now to FIGS. 5A-5B, schematic cross-sectional side view illustrations are provided for a pair of micro LEDs 150 taken along lines A-A and B-B, respectively, of FIG. 2 in accordance with an embodiment. In the embodiment illustrated, the donor substrate 100 can include the stabilization layer 110 on carrier substrate 102. The stabilization layer 110 can be molded and patterned to include the plurality of anchors 112 and staging cavities 120. A metal layer 160 can optionally be located on the stabilization layer 110 between the patterned electrically conductive layer 130 and the stabilization layer 110. For example, the metal layer 160 can be used to make electrical contact with the patterned electrically conductive layer 130, and optionally with a voltage source. The patterned electrically conductive layer 130 may be directly on the metal layer 160. The metal layer 160 can also, or alternatively, be used to transfer a potential (or ground) the micro LED 150 during the transfer process if the micro LED 150 happens to be pressed down and touch the bottom surface of the staging cavity 120. The metal layer 160 located within the staging cavities 120 can optionally be patterned to include a plurality of openings 162 completely through the metal layer 160 at the bottom surface of the staging cavities. Such patterning may reduce surface area and mitigate stiction if the micro LEDs 150 are pressed down and make contact with the metal layer 160. Thus, the patterned metal layer 160 within the staging cavities 120 can function to ground the micro LEDs 150 and be anti-stiction bumps. In the illustrated embodiment, the stabilization layer 110 occupies the plurality of openings 162. Thus, the bottom surface of the staging cavities 120 includes both the metal layer 160 and stabilization layer 110 within the openings 162.

Embodiments described herein are compatible with a variety of different LED configurations. In the exemplary embodiment illustrated, the LED 150 includes a p-n diode 140 including a top doped layer 144 doped with a first dopant type (e.g. n-type), a bottom doped layer 142 doped with a second dopant type (e.g. p-type) opposite the first dopant type, and an active layer 143 therebetween. For example, the active layer may include one or more quantum well layers separated by barrier layers. The p-n diode 140 may be formed of III-V or II-VI inorganic semiconductor-based materials, and be designed for emission at a variety of primary wavelengths, such as red, green, blue, etc.

The LED 150 may include a top contact layer 146 and bottom contact structure including the patterned electrically conductive layer 130 and bottom contact 152 (which may be a metal-stack). The top contact layer 146 may be one or more layers including a doped semiconductor layer, and may optionally include a transparent material, such as a transparent conductive oxide (TCO) such as indium-tin-oxide. The patterned electrically conductive layer 130 may be used to provide ohmic contact to the p-n diode 140 or be formed on another layer used to provide such ohmic contact. The bottom contact structure can include of number of combinations of layers such as an (ohmic) contact layer, mirror layer, barrier layer, and interface layer, though not all layers are required, and different layers may be included. For example, a bottom contact may include a first contact layer for ohmic contact, optional barrier layer, a mirror layer on the first contact layer, and a barrier layer on the mirror layer to prevent diffusion of a bonding layer. Various adhesion layers may be formed between any of the layers within the layer stack. In an embodiment, the patterned electrically conductive layer 130 includes a contact layer formed of a high work-function metal such as Ni, NiCr, Ru, and Ti. The bottom contact 152 may include a metal-stack including a mirror layer such as Ag, Al to reflect the transmission of the visible wavelength emitted from the p-n diode 140, followed by a diffusion barrier or adhesion layer such as Pt, Cu, Cr, Mo or Ti, and bonding layer such as Au or Ag. It is to be appreciated the described stack-up is exemplary, and the patterned conductive layer can be formed of any of these materials, amongst others, and multi-layer stacks of any combination of the materials.

The patterned electrically conductive layer 130 material may also be selected based on adhesion with the metal layer 160, or stabilization layer 110. Likewise, metal layer 160 may be selected based on adhesion with stabilization layer 110 in order to ensure repeatable adhesion and anchoring effect. The stabilization layer 110 may be formed of a variety of moldable materials. Some exemplary materials include matrix materials with an organic-based (e.g. carbon-based) backbone such as benzocyclobutene (BCB), polyimide, etc. or matrix materials with an inorganic-based backbone. For example, an inorganic-based backbone may be a silicon-based backbone, or other inorganic such as boron, phosphorus, silicon-oxide, etc. Exemplary inorganic-based backbone materials include siloxanes such as polydimethylsiloxane (PDMS), spin on glass (SOG), etc. Thermosetting materials such as BCB may be used for thermal stability and adhesion with certain materials. For example, Ni, Ru, Ti have high adhesion with BCB, with other metals such as Cr, Mo having lower adhesion, and materials such as Au having even lower adhesion with BCB.

Referring now to FIG. 6 and FIGS. 7A-7K, FIG. 6 is a flow chart for a method of forming an LED stabilization structure in accordance with an embodiment; FIGS. 7A-7K are schematic cross-sectional side view illustrations of a method of forming an LED stabilization structure in accordance with an embodiment. In interest of clarity and conciseness, FIGS. 6 and 7A-7K are described concurrently so as to not unnecessarily obscure the embodiments.

Figure 7A:
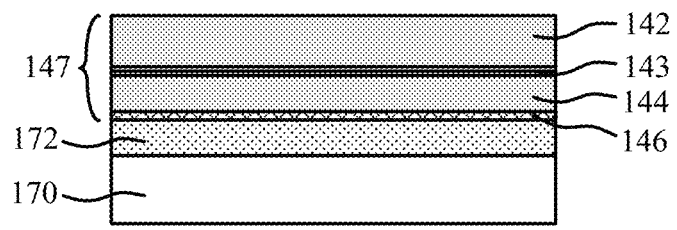
FIGS. 7A-7K are schematic cross-sectional side view illustrations of a method of forming an LED stabilization structure in accordance with an embodiment.
Figure 7B:
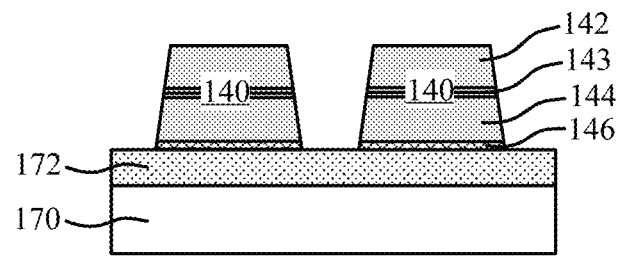

Referring to FIG. 7A, at operation 6010 a p-n diode layer 147 is provided on a first sacrificial layer 172, which may be supported by a handle substrate 170. The p-n diode layer 147 may include the optional top contact layer 146, top doped layer 144 doped with a first dopant type (e.g. n-type), a bottom doped layer 142 doped with a second dopant type (e.g. p-type) opposite the first dopant type, and an active layer 143 therebetween as previously described. The p-n diode layer 147 may be transferred to the handle substrate 170 and onto the first sacrificial layer 172 using suitable wafer bonding and lift-off techniques for example. The first sacrificial layer 172 may be formed of an oxide (e.g. $SiO_2$) or nitride (e.g. $SiN_x$), though other materials may be used which can be selectively removed with respect to the other layers. Handle substrate 170 can be any suitable substrate for processing, such as glass, silicon wafer, etc. The p-n diode layer 147 is then etched to form an array of mesas of p-n diodes 140 at operation 6020 as shown in FIG. 7B. A variety of wet and dry etching techniques can be used, optionally using the first sacrificial layer 172 as an etch stop layer.

Figure 7C:
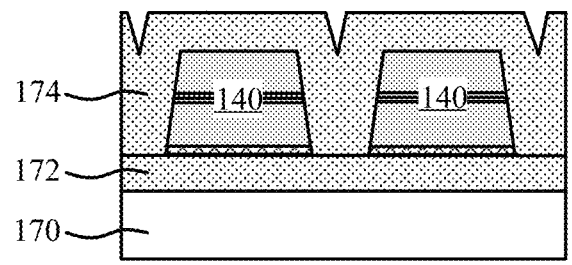
Figure 7D:
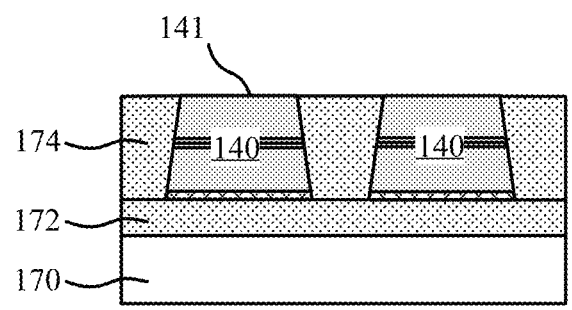
Figure 7E:
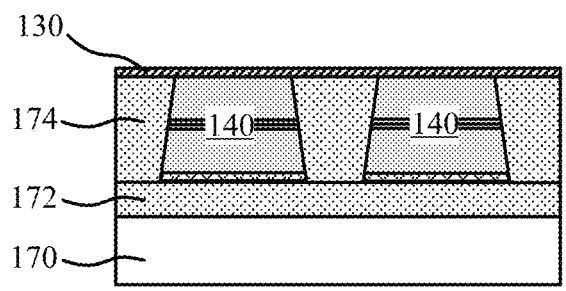
Figure 7F:
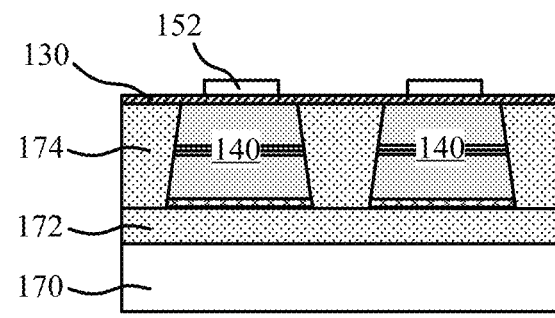

A second sacrificial layer 174 may then be deposited over the array of p-n diodes 140 (mesas) at operation 6030, as illustrated in FIG. 7C. The second sacrificial layer 174 may be formed of the same material as the first sacrificial layer 172. In an embodiment, the second sacrificial layer 174 is deposited using a chemical vapor deposition (CVD) technique such as plasma enhanced chemical vapor deposition (PECVD). The deposition technique does not necessarily need to deposit a high quality layer, since it will subsequently be removed, though the deposition technique should exhibit sufficient gap filling ability to cover the contour and fill the gaps between the p-n diode 140 mesas. Referring now to FIG. 7D, a chemical mechanical polishing (CMP) operation can then be performed to expose the bottom sides 141 of the p-n diodes 140, and provide a planar surface of the bottom sides 141 of the p-n diodes 140 and the second sacrificial layer 174, which serves as the surface for depositing and patterning the patterned electrically conductive layer 130 at operation 6040 as illustrated in FIG. 7E. The patterned electrically conductive layer 130 may be deposited using a suitable technique such as physical vapor deposition (PVD) (e.g. evaporation or sputtering) electroless plating, electroplating or CVD, and patterned using a suitable technique such as a photoresist lift-off technique or dry etching, such as with ion milling. Bottom contacts 152 may then be formed directly on patterned electrically conductive layer 130, and particularly the array of contact pads 134 at operation 6050 as illustrated in FIG. 7F.

Figure 7G:
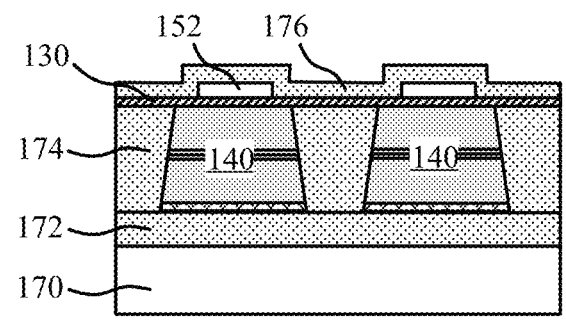
Figure 7H:
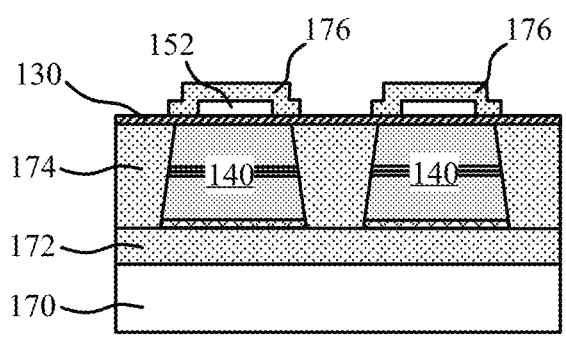

The remainder of the sacrificial layers and stabilization structure are then formed. Referring to FIG. 7G, at operation 6060 a sacrificial release layer 176 is then formed over the bottom contacts 152 and patterned electrically conductive layer 130. The thickness of the sacrificial release layer 176 will become the staging cavity 120 depth once removed. The sacrificial release layer 176 may be blanket deposited and then patterned (etched) as illustrated in FIG. 7H, which may define the specific staging cavities 120. In the illustrated embodiment, a separate area of sacrificial release layer 176 is provided for each micro LED. This will result in each micro LED having its own corresponding staging cavity 120, however this is not required and multiple micro LEDs can share the same staging cavity 120 and sacrificial release layer 176.

Figure 7I:
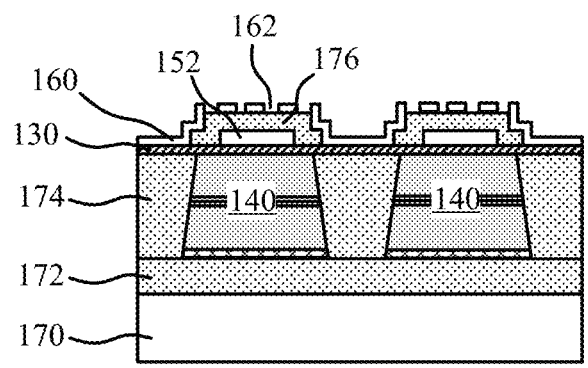

Referring now to FIG. 7I, at operation 6070 a metal layer 160 is optionally formed over the sacrificial release layer(s) 176 and on the patterned electrically conductive layer 130. Metal layer 160 may be deposited and patterned similarly as the patterned electrically conductive layer 130. Metal layer 160 may optionally be patterned to form openings 162 directly over the p-n diodes 140, bottom contacts 152, and sacrificial release layer(s) 176 to form anti-stiction bumps.

Figure 7J:
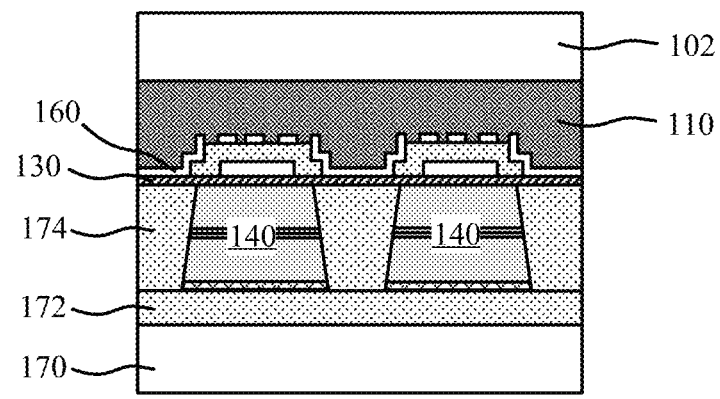
Figure 7K:
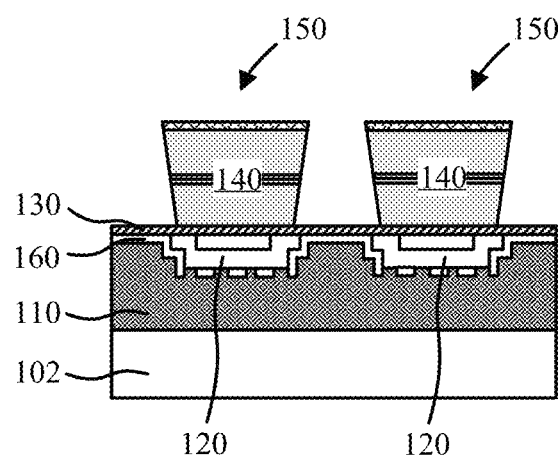

Referring now to FIG. 7J the topography of the patterned structure including the metal layer 160 and sacrificial release layer(s) 176 may be embedded in a stabilization layer 110 at operation 6080. The stabilization layer 110 in accordance with embodiments may be formed of a material suitable for substrate-substrate bonding, and capable of flowing into the openings 162 and between the separate sacrificial release layers 176. Some exemplary materials include matrix materials with an organic-based (e.g. carbon-based) backbone such as BCB, polyimide, etc. or matrix materials with an inorganic-based backbone. For example, an inorganic-based backbone may be a silicon-based backbone, or other inorganic such as boron, phosphorus, silicon-oxide, etc. Exemplary inorganic-based backbone materials include siloxanes such as PDMS, spin on glass (SOG), etc. This operation may also include bonding the opposite side of the stabilization layer 110 to a carrier substrate 102, such as glass, silicon wafer, etc.

At this point the structure can be suitable for storage or shipping, before or after removing the handle substrate 170. Once the micro LEDs 150 are ready for transfer the sacrificial layers 172, 174 and sacrificial release layer 176 are removed at operation 6090 as show in FIG. 7K. In an exemplary implementation, these layers can be removed by vapor hydrofluoric acid (HF) etch, which results in the tethered micro LEDs 150 being suspended above the stabilization cavities 120 and poised for pick up.

Since the micro LEDs 150 in accordance with embodiments are supported by the patterned electrically conductive layer, a voltage can be applied to the bottom contacts of the p-n diodes 140 for electrical testing prior to being transferred. For example, this can be accompanied by probing to the top sides 149 of the micro LEDs 150 or forming test structures over test LEDs. It is to be appreciated that such testing can be performed at various stages. For example, testing can be performed after removing sacrificial layer 172 and prior to removal of sacrificial layer 174. This may allow for testing of a more structurally robust structure.

Figure 8:
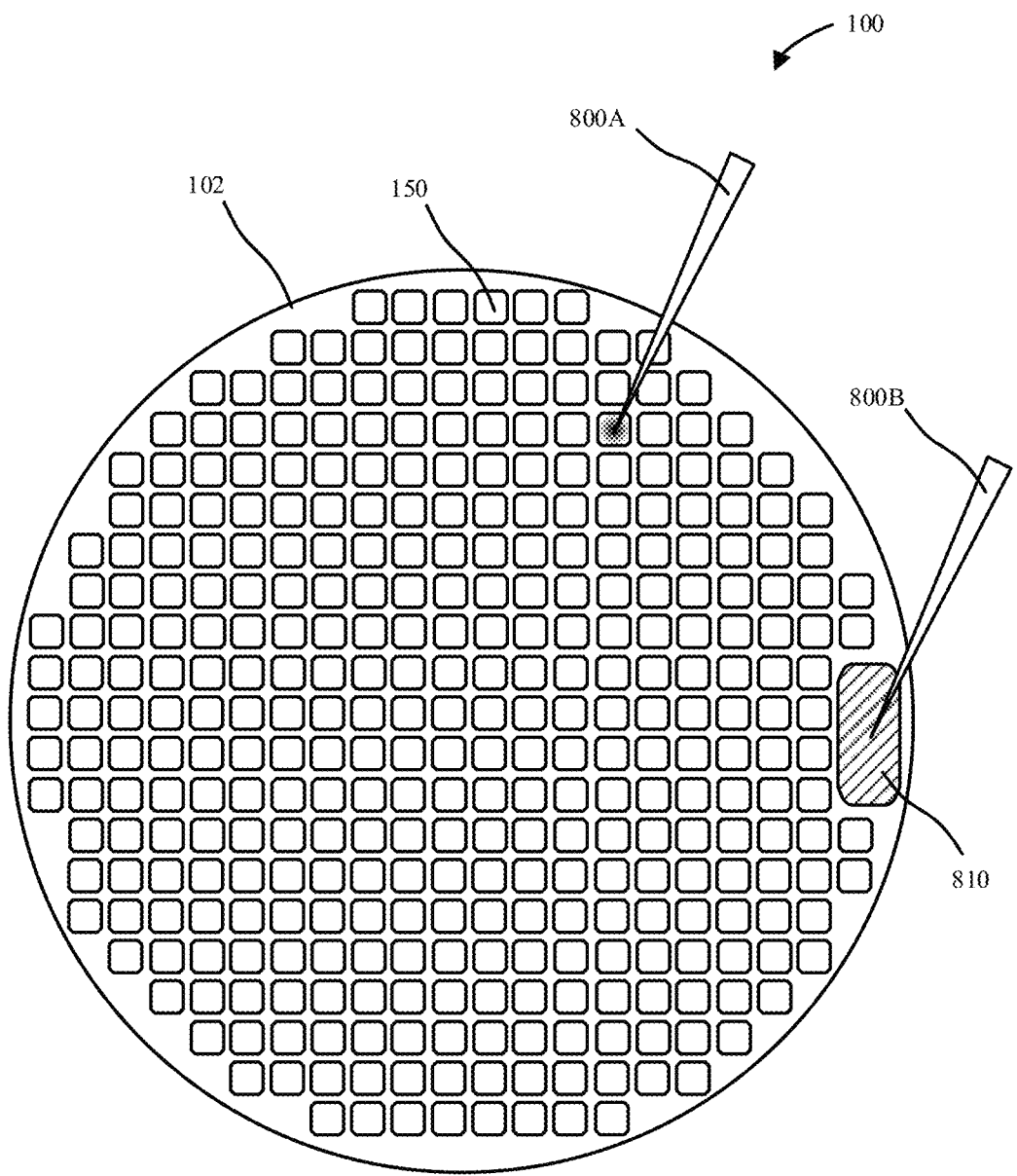
FIG. 8 is a schematic top view illustration of a donor substrate structure for probing an LED for operability in accordance with an embodiment.

FIG. 8 is a schematic top view illustration of a donor substrate structure for probing a micro LED for operability in accordance with an embodiment. The donor substrate 100 illustrated in FIG. 8 can have one or more test pads 810 which are electrically connected to the metal layer 160 and/or patterned electrically conductive layer 130, and may be formed of either layer. As shown, a probe 800B can contact the test pad 810 while a probe tip 800A can contact an individual micro LED 150, such as top contact layer 146, with the probe tip 800A at another potential or voltage level. Upon contact, an electrical circuit is completed, where an operable micro LED 150 will light up to indicate operability. In particular, luminance can be measured to determine whether a threshold value is obtained. Thus, each micro LED 150 in FIG. 8 can be a test micro LED.

Figure 9:
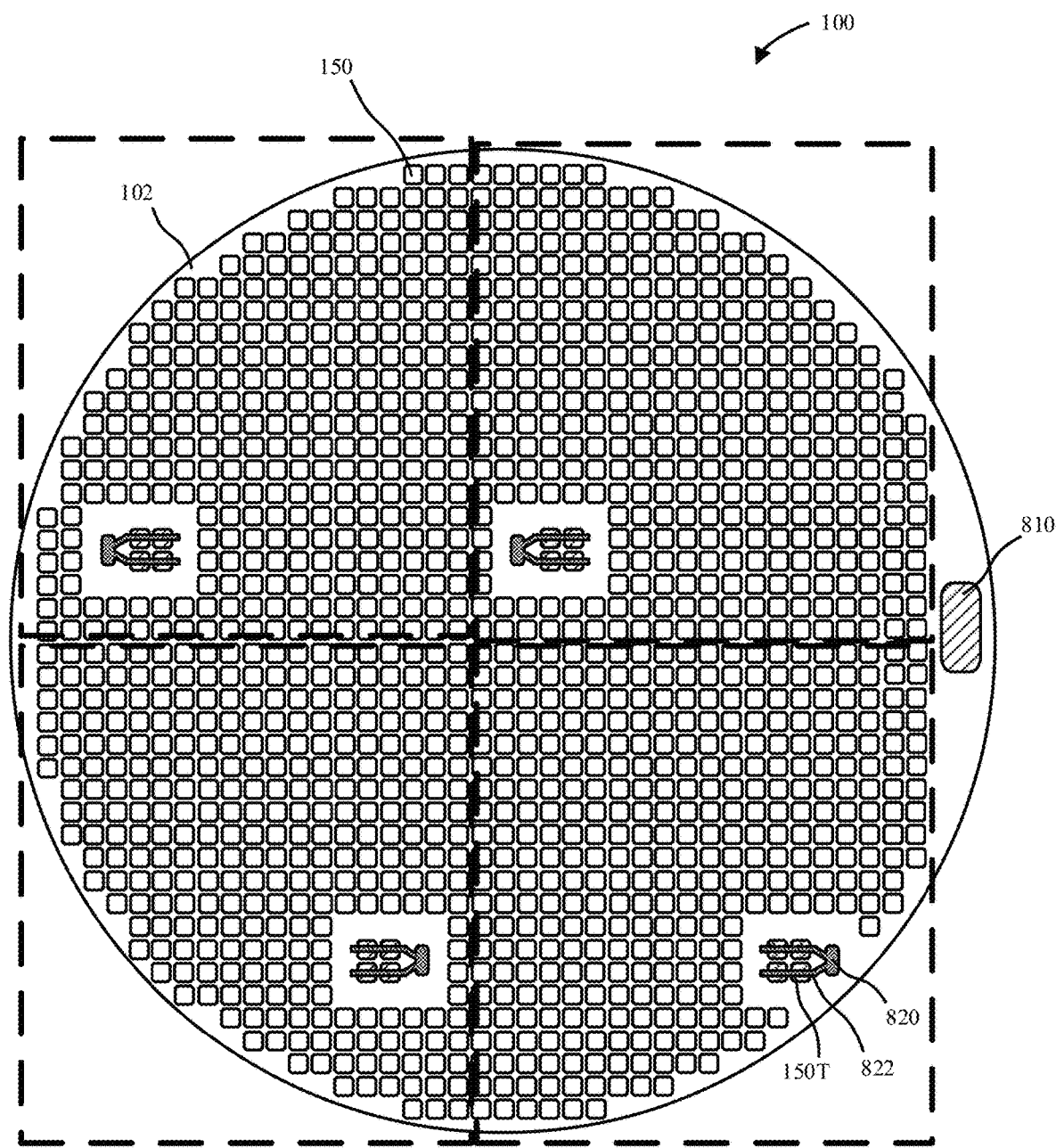
FIG. 9 is a schematic top view illustration of a donor substrate including a plurality of groups of test LEDs in accordance with an embodiment.

FIG. 9 is a schematic top view illustration of a donor substrate 100 including a plurality of groups of test micro LEDs 150T in accordance with an embodiment. A noticeable difference in FIG. 9 is the inclusion of permanent test micro LEDs 150. In such an embodiment, a conductor pattern 822 is formed over one or more test micro LEDs 150T and in electrical connection with a local test pad 820. Such a conductor pattern 822 is not formed over the micro LEDs 150 that are eligible for transfer. Similar to the description of FIG. 8, probes can be connected to test pad 810 (which can also be local), and local test pad 820. A plurality of local test pads 810 can be included for both FIG. 8 and FIG. 9. Completion of the circuit then lights up the one or more test micro LEDs 150T. The luminance can then be measured to determine likelihood of known good LEDs in a corresponding area of the donor substrate 100. The illustrated example of FIG. 9 shows four quadrants of corresponding areas, though this is exemplary, and any arrangement can be used.

Up until this point a particular micro LED 150 and stabilization structure configuration has been described in which the tethers are formed as part of the bottom contact structure. However, this is not strictly required, and tethering can alternatively be achieved with top contact structures. This may result in certain processing changes. This may also allow for implementation of tethering structures with alternative micro devices, such as micro chips with top facing contacts or landing pads.

Figure 10:
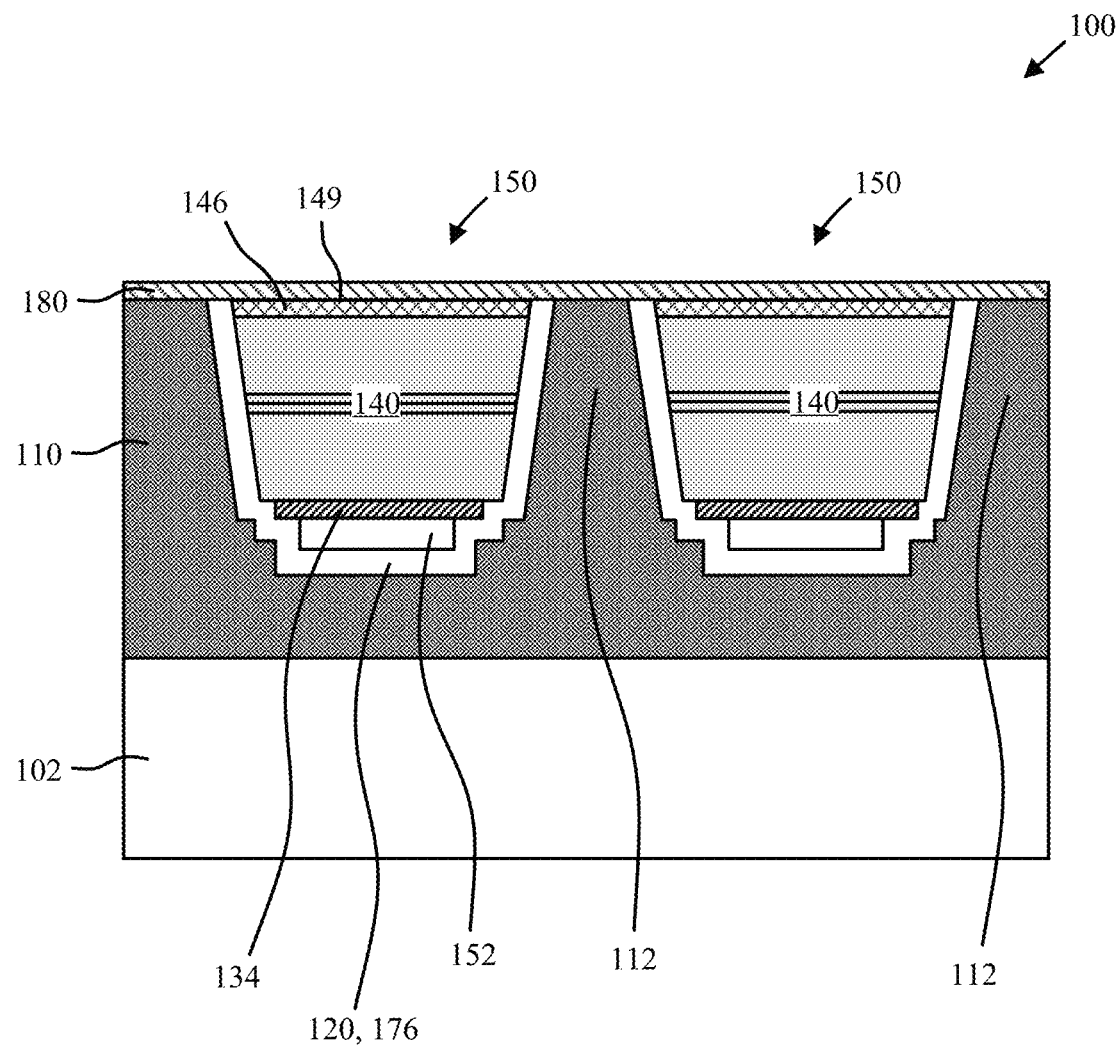
FIG. 10 is schematic cross-sectional side view illustration of a pair of stabilized LEDs in accordance with an embodiment.
Figure 11:
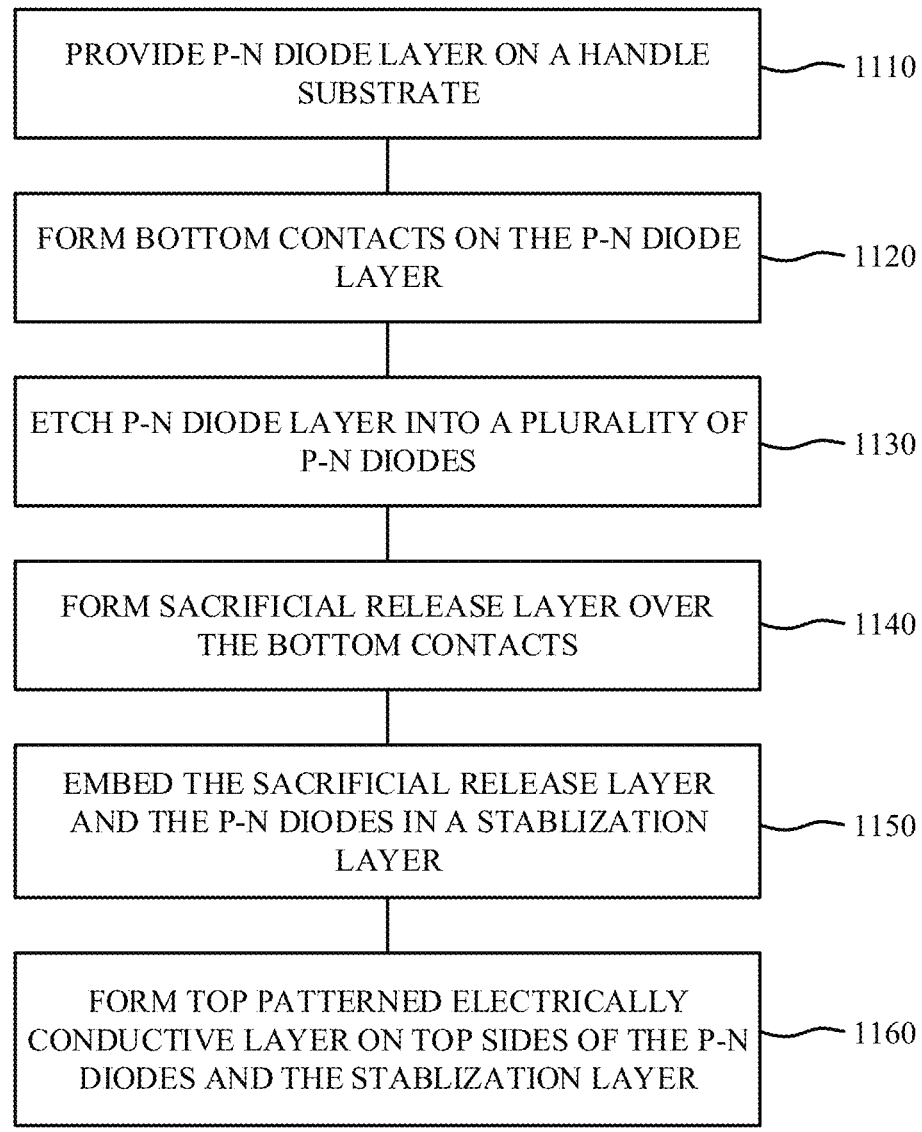
FIG. 11 is a flow chart for a method of forming an LED stabilization structure in accordance with an embodiment.

FIG. 10 is schematic cross-sectional side view illustration of a pair of stabilized LEDs in accordance with an embodiment. FIG. 10 shares the general layout and stabilization schemes with bottom tethered stabilization structures described this point. For example, the top patterned electrically conductive layer 180 may be patterned similarly as the patterned electrically conductive layer 130, including contact pads and a plurality of tethers. The top patterned electrically conductive layer 180 may be formed of the same or different materials as the patterned electrically conductive layer 130. For example, where the micro device is a micro LED 150, the top patterned electrically conductive layer 180 may be formed of a transparent or semi-transparent material, such as a TCO. Additional variations may be present, such as the p-n diode 140 being inside the stabilization cavity 120, and anchors 112 may be taller compared to previous embodiments.

Referring now to FIG. 11 and FIGS. 12A-12F, FIG. 11 is a flow chart for a method of forming an LED stabilization structure in accordance with an embodiment; FIGS. 12A-12F are schematic cross-sectional side view illustrations of a method of forming an LED stabilization structure in accordance with an embodiment. In interest of clarity and conciseness, FIGS. 11 and 12A-12F are described concurrently so as to not unnecessarily obscure the embodiments.

Figure 12A:
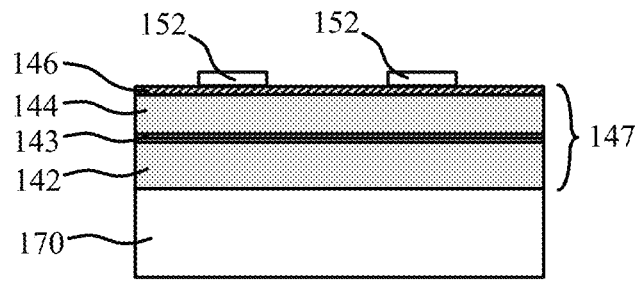
FIGS. 12A-12F are schematic cross-sectional side view illustrations of a method of forming an LED stabilization structure in accordance with an embodiment.

Referring to FIG. 12A, at operation 1110 a p-n diode layer 147 is provided on a handle substrate 170. For example, the handle substrate 170 may be a growth substrate (e.g. SiC, sapphire, etc.) or alternatively the p-n diode layer 147 can be transferred to the handle substrate 170. In such instances, the handle substrate 170 can be any suitable substrate for processing, such as glass, silicon wafer, etc. An array of bottom contacts 152 may then be formed on the p-n diode layer 147 at operation 1120. The bottom contacts 152 may be deposited and patterned similarly as the bottom contacts 152 described with regard to operation 6050, and may include the ohmic contact layer.

Figure 12B:
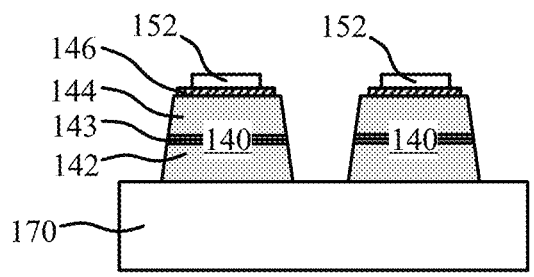

The p-n diode layer 147 is then etched to form an array of mesas of p-n diodes 140 at operation 1130 as shown in FIG. 12B. A variety of wet and dry etching techniques can be used, optionally using the first sacrificial layer 172 as an etch stop layer. Referring to FIG. 12C, at operation 1140 a sacrificial release layer 176 is then formed over the bottom contacts 152 and the p-n diode 140 mesas. The thickness of the sacrificial release layer 176 will become the staging cavity 120 depth once removed. The sacrificial release layer 176 may be blanket deposited and then patterned (etched) as illustrated in FIG. 12D, which may define the specific staging cavities 120.

Figure 12E:
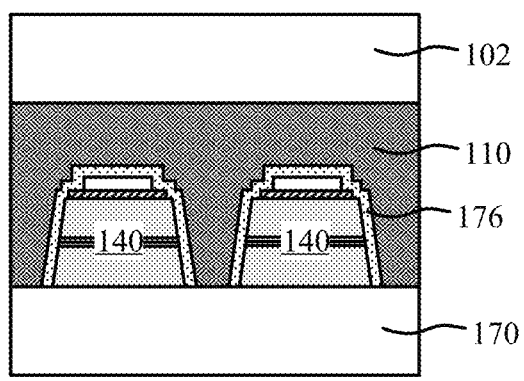
Figure 12C:
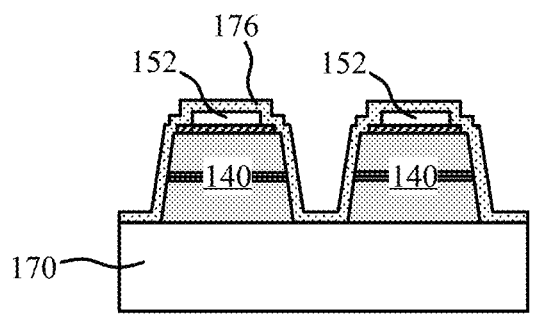
Figure 12F:
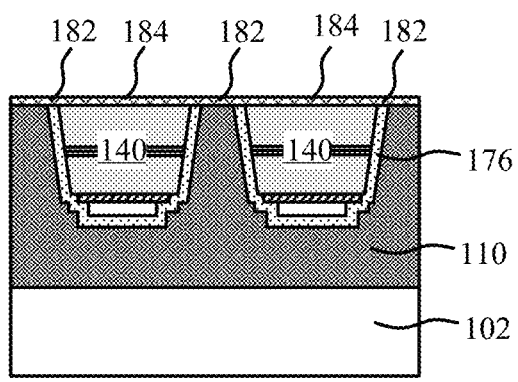
Figure 12D:
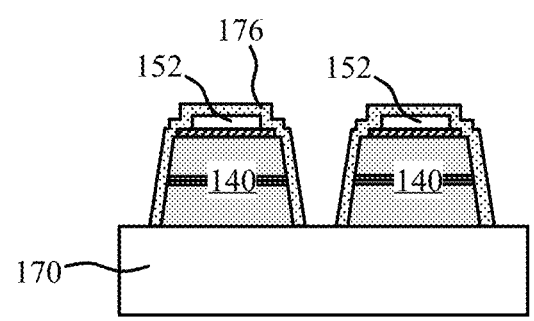

Referring now to FIG. 12E the topography of the patterned structure including the bottom contacts 152, p-n diode 140 mesas, and sacrificial release layer(s) 176 may be embedded in a stabilization layer 110 at operation 1150 similar to operation 6080. The handle substrate 170 may then be removed followed by formation of the top patterned electrically conductive layer 180 on the top sides 149 of the p-n diodes 140 and the stabilization layer 110 at operation 1160. The top patterned electrically conductive layer 180 may be patterned similarly as the patterned electrically conductive layer 130, for example to include (top) contact pads for the micro LEDs and tethers 132.

Figure 13:
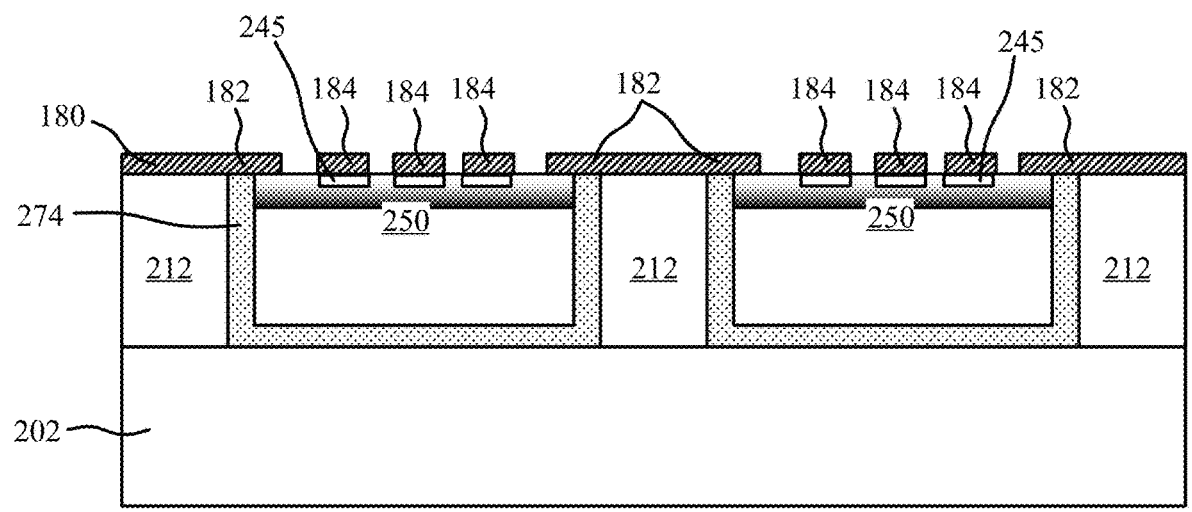
FIG. 13 is schematic cross-sectional side view illustration of a pair of stabilized micro devices in accordance with an embodiment.
Figure 14:
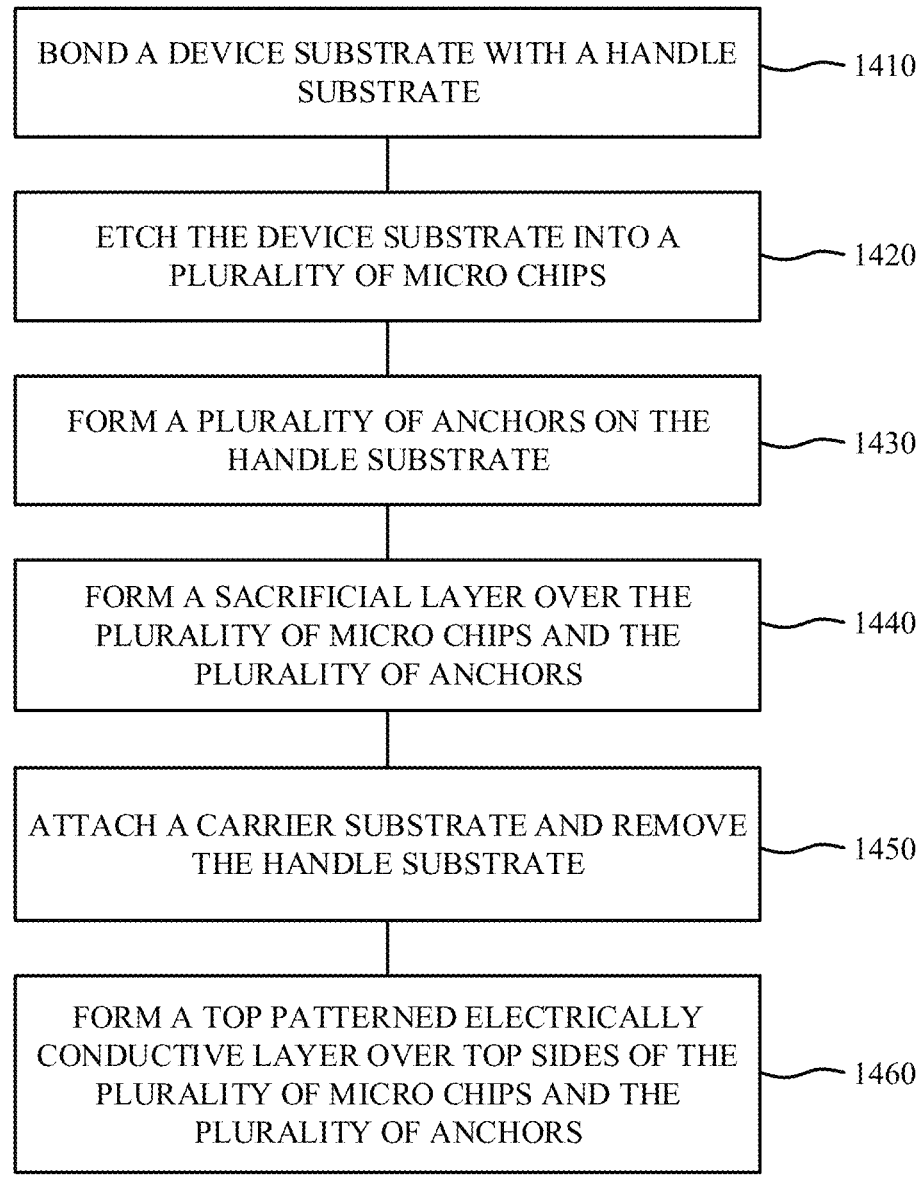
FIG. 14 is a flow chart for a method of forming a micro device stabilization structure in accordance with an embodiment.

FIG. 13 is schematic cross-sectional side view illustration of a pair of stabilized micro devices in accordance with an embodiment. In particular, FIG. 13 includes a pair of stabilized micro chips 250 in accordance with an embodiment. FIG. 13 shares the general layout and stabilization schemes with top tethered micro LED 150 stabilization structures described with regard to FIG. 10. Since the micro chips 250 may not have optical performance, the top patterned electrically conductive layer 180 may be formed of opaque, metallic layers similar to the patterned electrically conductive layer 130 previously described. In the particular micro chip 250 application, it may not be necessary to make ohmic contact with a III-V material. Rather, the top patterned electrically conductive layer 180 may optionally make contact with back-end-of-the-line (BEOL) build-up structure interconnect materials, such as copper, aluminum, silver, gold, molybdenum, tantalum, etc., any of which may also be used for the formation of the top patterned electrically conductive layer 180. Alternatively, the top patterned electrically conductive layer 180 is used only for tethering, and not for making electrical contacts with the micro chips 250. In this respect, it may not be necessary for the tethering material (e.g. the top patterned electrically conducive layer 180) to be electrically conductive, though the properties of metals (and hence electrical conductivity, can facilitate mechanical tethering aspects of the embodiments).

In the illustrated embodiment, the micro chips 250 may be embedded within a sacrificial layer 274 between an arrangement of anchors 212 supported by a carrier substrate 202. Carrier substrate 202 may be any suitable carrier substrate similar to carrier substrate 102. In an embodiment, the anchors 212 may be plugs (e.g. silicon, metal, etc.) arranged around the micro chips 250 in a similar fashion as anchors 112 previously described (e.g. bollards, walls, etc.). Sacrificial layer 274 may be formed of materials capable of being selectively removed, similar to second sacrificial layer 174.

Referring now to FIG. 14 and FIGS. 15A-15G, FIG. 14 is a flow chart for a method of forming a micro device stabilization structure in accordance with an embodiment; FIGS. 15A-15G are schematic cross-sectional side view illustrations of a method of forming a micro device stabilization structure in accordance with an embodiment. In interest of clarity and conciseness, FIGS. 14 and 15A-15G are described concurrently so as to not unnecessarily obscure the embodiments.

Figure 15A:
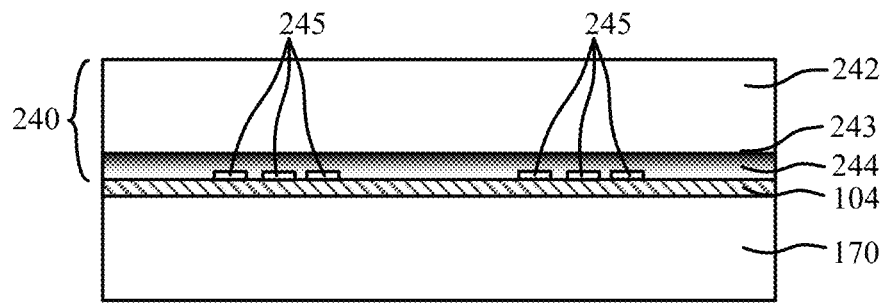
FIGS. 15A-15G are schematic cross-sectional side view illustrations of a method of forming a micro device stabilization structure in accordance with an embodiment.
Figure 15B:
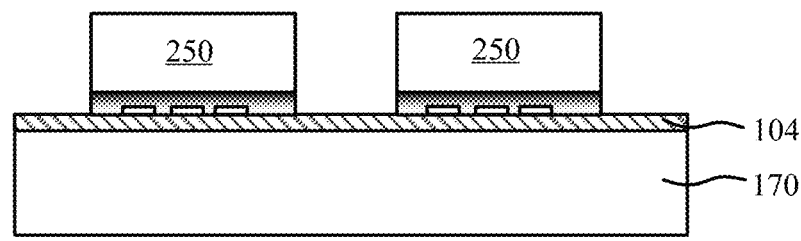

Referring to FIG. 15A at operation 1410 a device substrate 240 may be bonded with a handle substrate 170. For example, this may be achieved with bonding layer 104, which can be a variety of material such as adhesive material (e.g. polymeric tape), or a dielectric material (e.g. oxide layer for oxide-oxide bonding). In an embodiment the device substrate 240 includes a base substrate 242 such as a silicon wafer and device layer 243 into which a plurality of devices (e.g. transistors, capacitors, etc.) are directly formed in, and a build-up layer 244 which can include back-end-of-the-line (BEOL) routing and interconnect structures, terminating with landing pads 245. The device substrate 240 may then be etched at operation 1420 to form an array of micro chips 250 as shown in FIG. 15B.

Figure 15C:
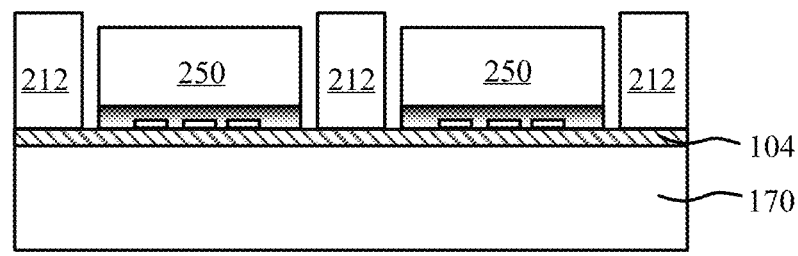
Figure 15D:
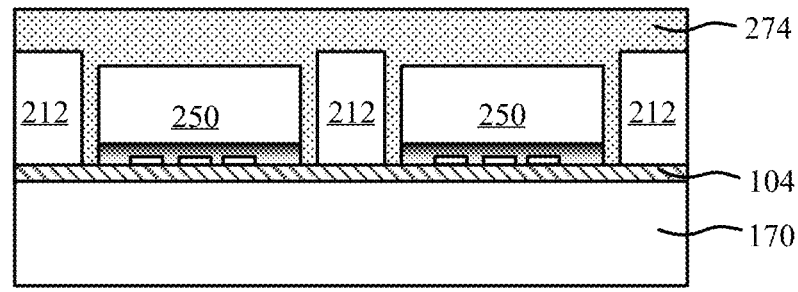
Figure 15E:
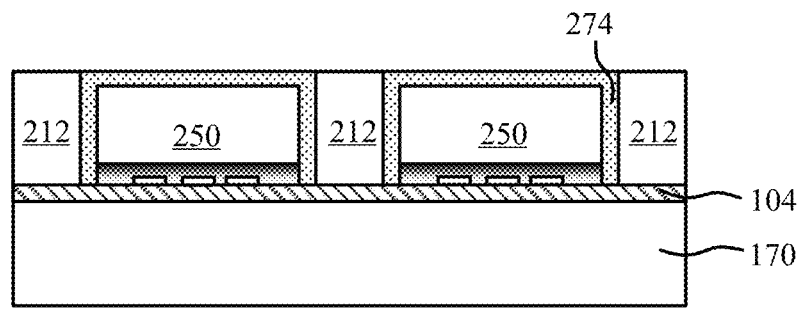
Figure 15F:
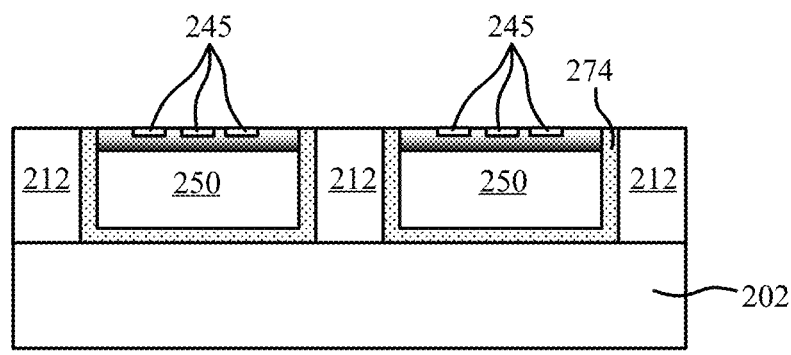

Following the formation of the array of micro chips 250 an arrangement of anchors 212 is placed on the handle substrate 102, such as on the bonding layer 104, at operation 1430 as shown in FIG. 15C. The anchors 212 may define the shape and depth of what will become the staging cavities. Referring now to FIG. 15D, at operation 1440 a sacrificial layer 274 is formed over the plurality of micro chips 250 and the plurality of anchors 212. For example, sacrificial layer 274 may be formed similarly as the second sacrificial layer 174 described with regard to operation 6030, filling caps between the micro chips 250 and anchors 212 and covering the micro chips 250 and anchors 212. This can be followed by a CMP operation to reduce a thickness of the sacrificial layer 274. As shown in FIG. 15E, polishing may stop once the anchors 212 are exposed. The remaining thickness of the sacrificial layer 274 over the micro chips 250 may then create the staging cavity depth. A carrier substrate 202 can then be attached and handle substrate 170 removed at operation 1450 as shown in FIG. 15F.

Figure 15G:
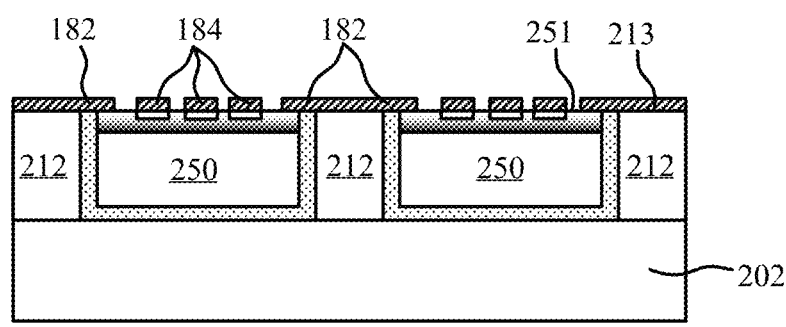

A top patterned electrically conductive layer 180 can then be formed over the top sides 251 of the plurality of micro chips 250 and the top sides 213 of the plurality of anchors 212 at operation 1460 as illustrated in FIG. 15G. The top patterned electrically conductive layer 180 can be formed and patterned similarly as the top patterned electrically conductive layer 180 described with regard to operation 1160. As shown, each micro chip 250 may include a plurality of tethers 182, and optionally a plurality of contact pads 184 formed on a plurality of landing pads 245. The plurality of tethers 182 can optionally extend from the contact pads 184, for example, to assist with testing. However, this is not required. The sacrificial layer 274 may then be selectively removed prior to the transfer sequence as previously described.

Figure 16:
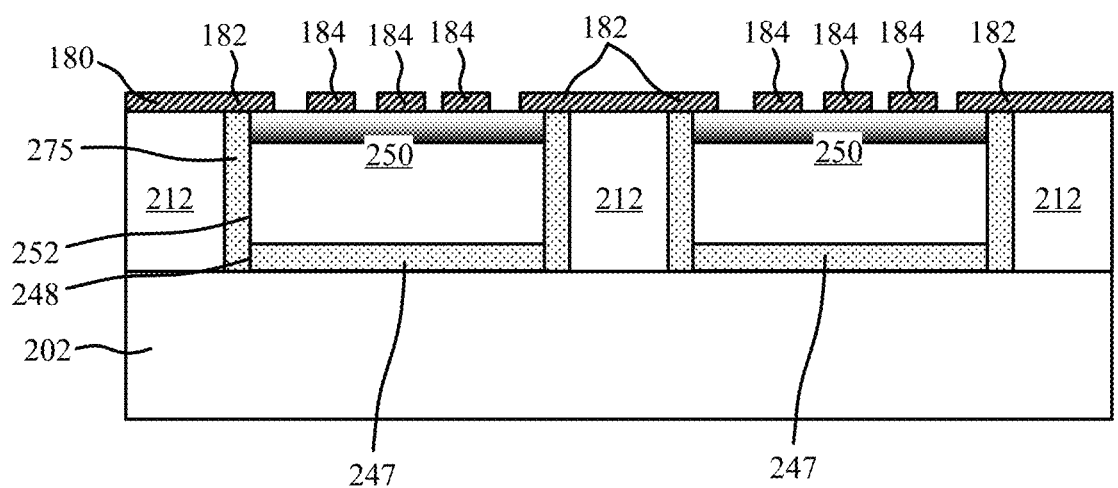
FIG. 16 is schematic cross-sectional side view illustration of a pair of stabilized micro devices in accordance with an embodiment.
Figure 17:
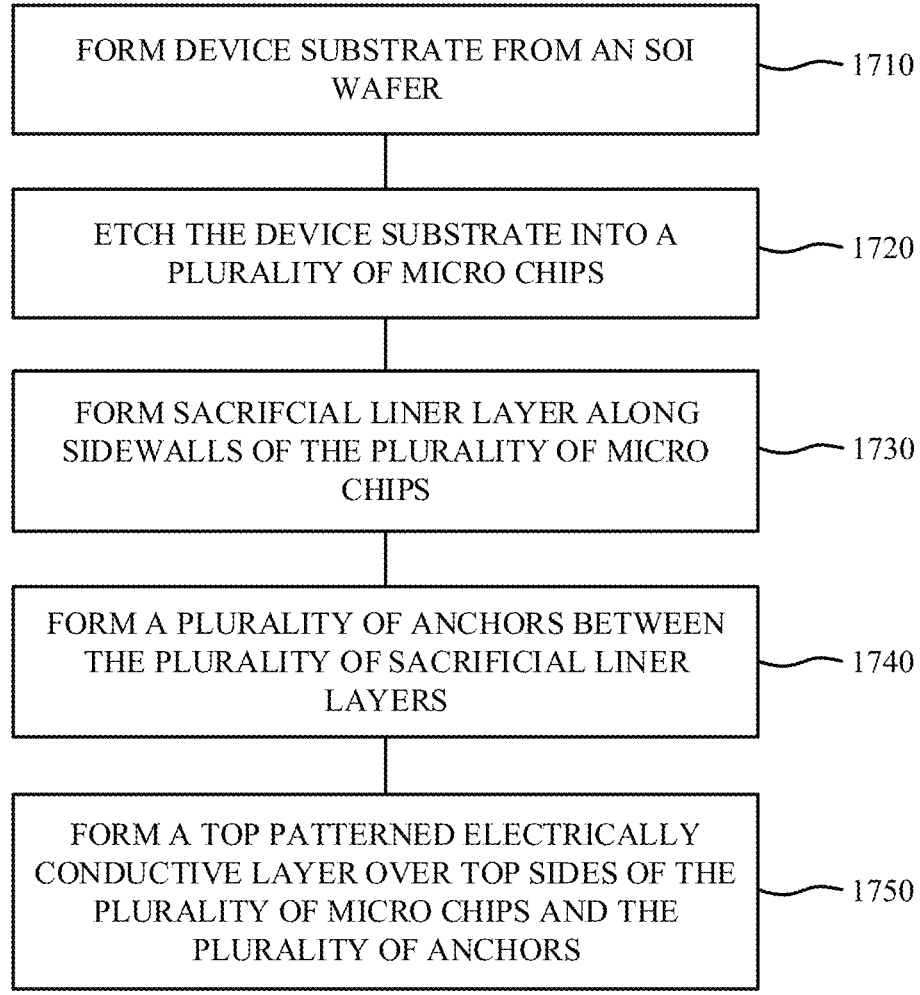
FIG. 17 is a flow chart for a method of forming a micro device stabilization structure in accordance with an embodiment.

FIG. 16 is schematic cross-sectional side view illustration of a pair of stabilized micro devices in accordance with an embodiment. In particular, FIG. 16 includes a pair of stabilized micro chips 250 in accordance with an embodiment. FIG. 16 shares the general layout and stabilization schemes with top tethered micro LED 150 stabilization structures described with regard to FIG. 10 and FIG. 13. In the illustrated embodiment, the micro chips 250 may be embedded within multiple sacrificial layers. In particular, the micro chips 250 may be supported by a sacrificial buried oxide layer 247, which can be the remnant of a silicon-on-insulator (SOI) substrate. Furthermore, a sacrificial liner layer 275 can span along sidewalls 252 of the micro chips 250, as well as sidewalls 248 of the sacrificial buried oxide layer 247. Anchors 212 can be formed in the space between the sacrificial liner layers 275 between adjacent micro chips 250. In an embodiment, the anchors 212 may be plugs (e.g. polymer, glass, etc.) capable of filling openings between the sacrificial liner layers 275, and can be arranged around the micro chips 250 in a similar fashion as anchors 112 previously described (e.g. bollards, walls, etc.). Sacrificial buried oxide layer 247 and sacrificial liner layer 275 may be formed of materials capable of being selectively removed (e.g. silicon oxide, etc.).

Referring now to FIG. 17 and FIGS. 18A-18G, FIG. 17 is a flow chart for a method of forming a micro device stabilization structure in accordance with an embodiment; FIGS. 18A-18G are schematic cross-sectional side view illustrations of a method of forming a micro device stabilization structure in accordance with an embodiment. In interest of clarity and conciseness, FIGS. 17 and 18A-18G are described concurrently so as to not unnecessarily obscure the embodiments.

Figure 18A:
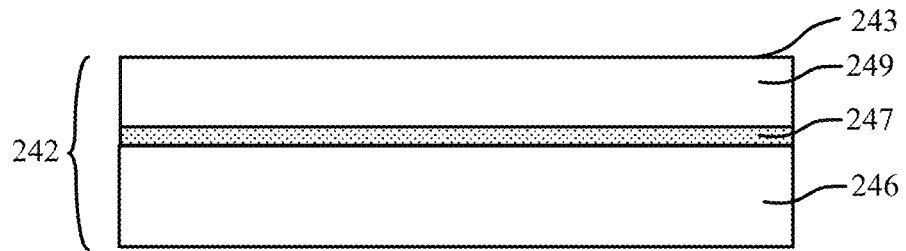
FIGS. 18A-18G are schematic cross-sectional side view illustrations of a method of forming a micro device stabilization structure in accordance with an embodiment.
Figure 18B:
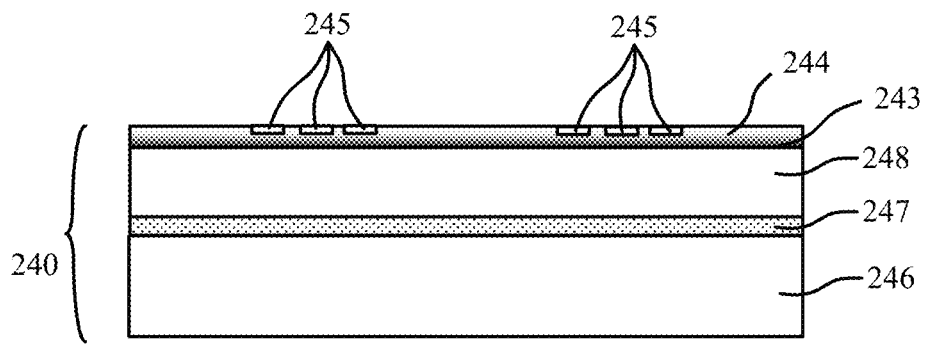
Figure 18C:
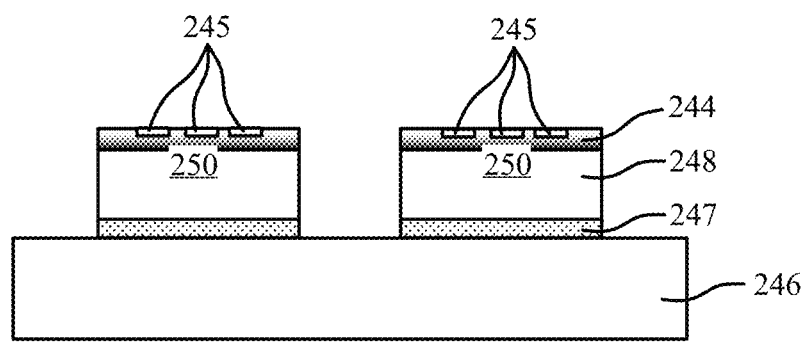

Referring now to FIG. 18A the processing sequence can begin with a base substrate 242 such as a silicon-on-insulator (SOI) wafer, for example, though other equivalent materials can be used. As shown, the SOI wafer can include a bulk substrate 246, such as a single crystalline silicon layer, a buried oxide layer 247 (e.g. silicon oxide). A buffer layer 249 and device layer 243 are located on top of the buried oxide layer 247. At operation 1710 the SOI wafer is formed into a device substrate 240. Specifically, a plurality of devices (e.g. transistors, capacitors, etc.) are formed in the device layer 243. As illustrated, the device substrate 240 includes the bulk substrate 246, buried oxide layer 247, buffer layer 249 and device layer 243 of the SOI wafer. The device substrate 240 further includes a build-up layer 244 which can include BEOL routing and interconnect structures, terminating with landing pads 245. The device substrate 240 may then be etched at operation 1720 to form a plurality of micro chips 250 as shown in FIG. 18C. As shown, the etching may extend through the buried oxide layer 247 exposing the bulk substrate 246.

Figure 18D:
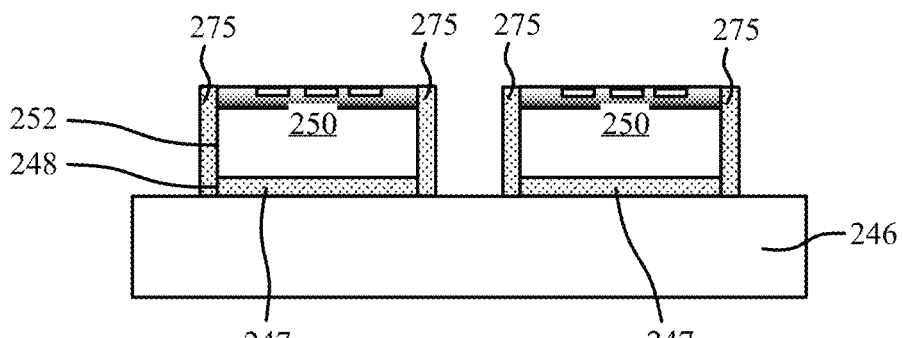
Figure 18E:
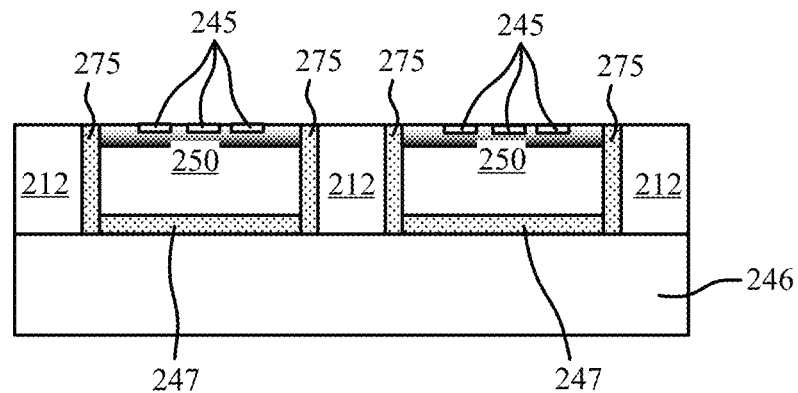
Figure 18F:
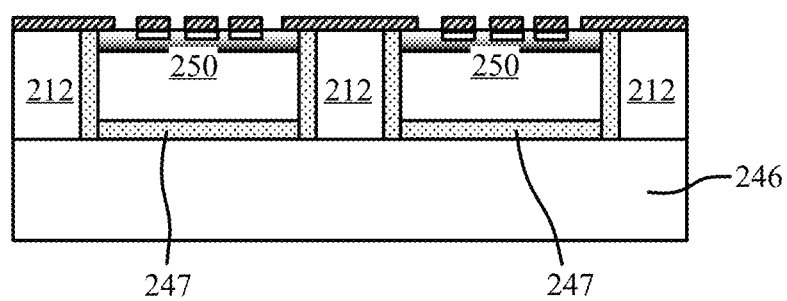
Figure 18G:
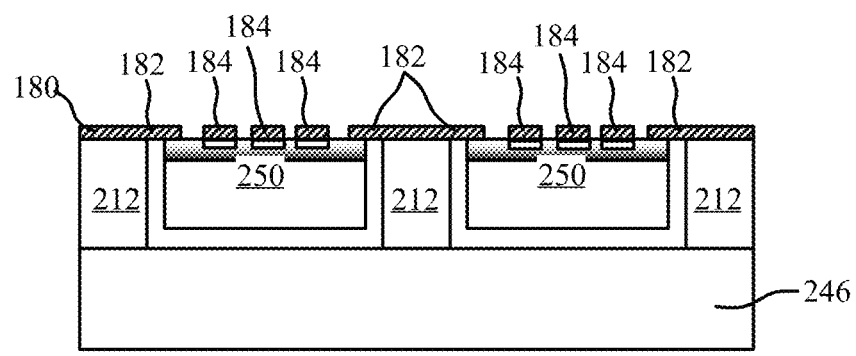

Referring now to FIG. 18D, at operation 1730 a sacrificial liner layer 275 is formed along sidewalls of the plurality of micro chips 250, as wells as sidewalls of the etched buried oxide layer 247. As shown, the sacrificial liner layer 275 is conformal to the sidewalls, and may have a substantially uniform thickness along the sidewalls. The sacrificial liner layer 275 may be deposited, for example using CVD or PECVD technique. A plurality of anchors 212 can then be formed between the plurality of sacrificial liner layers 275 that are between adjacent micro chips 250 at operation 1740, as shown in FIG. 18E. The anchors 212 may be formed a material capable of filling the gaps/trenches between the micro chips 250. For example, a material may be deposited or dispensed within the spaces. Molding materials, such as polymer or glass paste may be suitable materials, for example, A top patterned electrically conductive layer 180 can then be formed over the top sides of the plurality of micro chips and the plurality of anchor at operation 1750 to form the tether structure. The top patterned electrically conductive layer 180 can be formed and patterned similarly as the top patterned electrically conductive layer 180 described with regard to operations 1160 and 1460. As shown, each micro chip 250 may include a plurality of tethers 182, and optionally a plurality of contact pads 184 formed on a plurality of landing pads 245. The plurality of tethers 182 can optionally extend from the contact pads 184, for example, to assist with testing. However, this is not required. The sacrificial layers including the sacrificial liner layer 275 and buried oxide layer 247 may then be selectively removed as illustrated in FIG. 18G prior to the transfer sequence.

Up until this point various micro device stabilization structures have been described in which the patterned electrically conductive layers 130 and top patterned electrically conductive layers 180 can be single layers, or multiple layer stacks. The patterned electrically conductive layers 130 and top patterned electrically conductive layers 180 may also include overlapping layers, such as layers of dissimilar materials (e.g. metallic materials, inclusive of metals). In an embodiment, the patterned electrically conductive layer 130 includes multiple layers including a first material layer and a second material layer, with the first material layer and the second material layer overlapping along the array of tethers. Overlapping areas between the first material layer and a second material layer form a joint that can be delaminated during the transfer sequence.

Figure 19A:
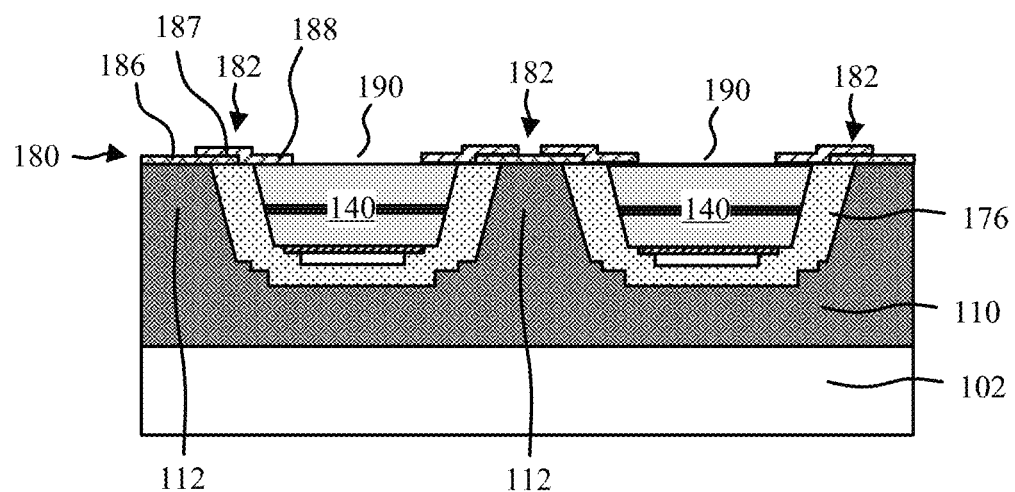
FIG. 19A is a schematic cross-sectional side view illustration of a pair of LEDs stabilized with bi-material tethers in accordance with an embodiment.
Figure 19B:
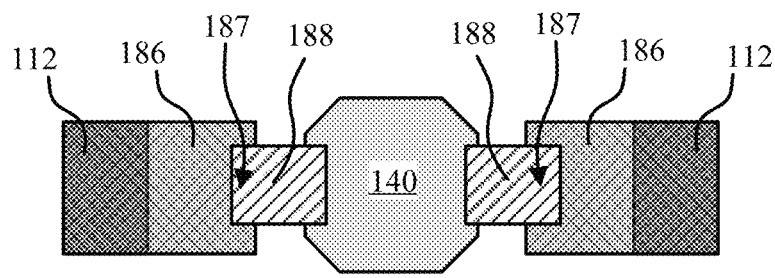
FIG. 19B is a schematic top view illustration of an LED of FIG. 19A in accordance with an embodiment.

Referring now to FIGS. 19A-19B schematic cross-sectional side view and top view illustrations are provided for LEDs stabilized with bi-material tethers 182. As shown, the tethers 182 can include overlapping layers of a first material layer 186 and a second material layer 188 which overlap to form an interface 187 therebetween. In particular FIGS. 19A-19B illustrate a version of the stabilized LEDs of FIG. 10. In an embodiment, the first material layer 186 and the second material layer 188 are formed of different materials, such as different metallic materials. The first material layer 186 and second material layer 188 may be formed of any of the materials used to form the patterned electrically conductive layers 130 and top patterned electrically conductive layers 180 previously described. Where the second material layer 188 is opaque, an aperture 190 may be formed over the top surface of the p-n diode 140 for light extraction.

In an embodiment, a bi-metallic, or bi-metal, configuration is provided in which the interface 187 is designed to delaminate under shear load (for example from the transfer head) and break in a deterministic location. In an embodiment, the dissimilar materials form an intermetallic compound at the interface 187 which breaks before either of the dissimilar materials forming the first material layer 186 and the second material layer 188. The tethers 182 illustrated in FIGS. 19A-19B may be patterned similarly as other tether designs herein.

Figure 20:
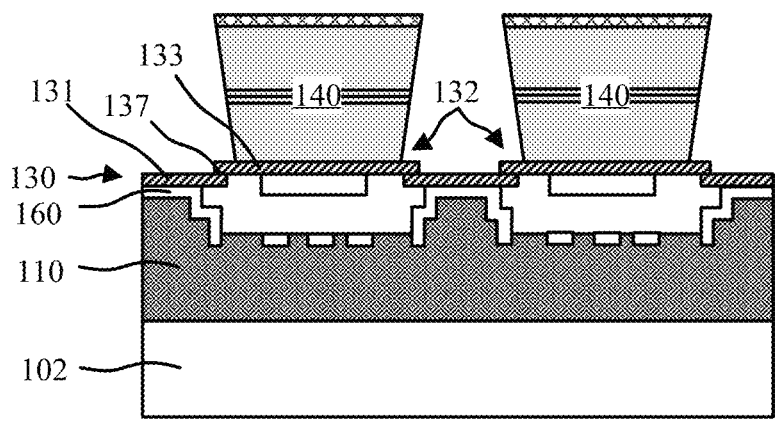
FIG. 20 is a schematic cross-sectional side view illustration of a pair of LEDs stabilized with bi-material tethers in accordance with an embodiment.

FIG. 20 is a schematic cross-sectional side view illustration of a pair of LEDs stabilized with bi-material tethers in accordance with an embodiment. In particular FIGS. 19A-19B illustrate a version of the stabilized LEDs of FIGS. 5A-5B. Similar to the above description with regard to FIGS. 19A-19B, the tethers 132 can include overlapping layers of a first material layer 131 and a second material layer 133 which overlap to form an interface 137 therebetween. In an embodiment, the first material layer 131 and the second material layer 133 are formed of different materials, such as different metallic materials. The first material layer 131 and second material layer 133 may be formed of any of the materials used to form the patterned electrically conductive layers 130 and top patterned electrically conductive layers 180 previously described, and may from a bi-metallic compound at the interface 137 to facilitate breaking in a deterministic location.

Figure 21:
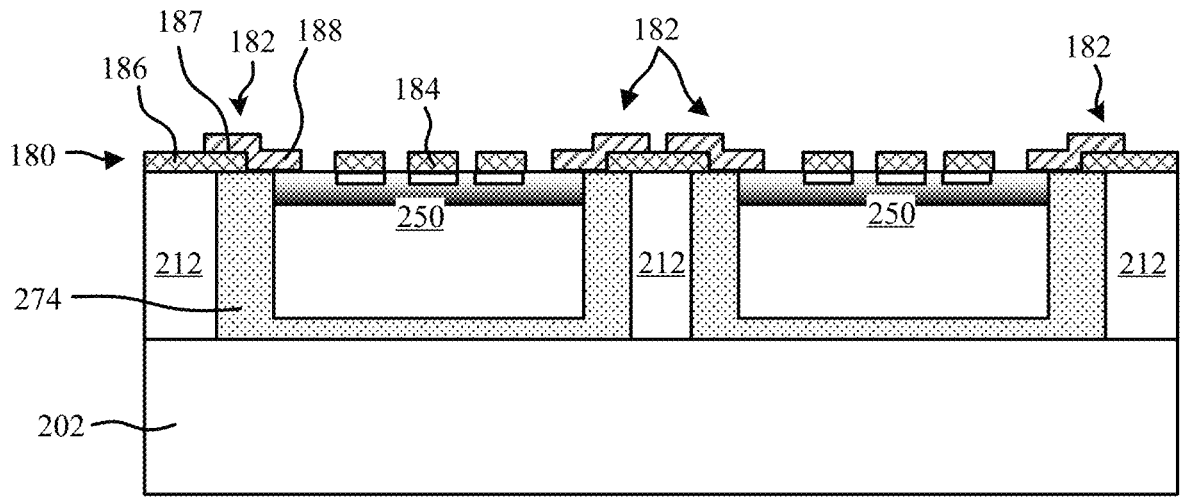
FIG. 21 is schematic cross-sectional side view illustration of a pair micro devices stabilized with bi-material tethers in accordance with an embodiment.
Figure 22:
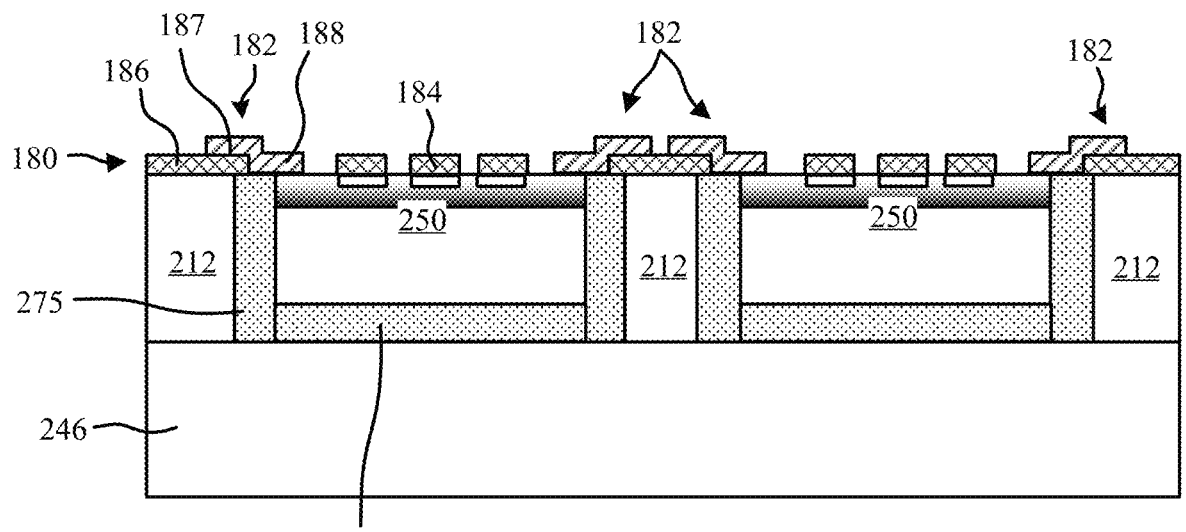
FIG. 22 is schematic cross-sectional side view illustration of a pair micro devices stabilized with bi-material tethers in accordance with an embodiment.

Referring now to FIGS. 21-22 schematic cross-sectional side view illustrations are provided for a pair of micro devices stabilized with bi-material tethers 182 in accordance with embodiments. In particular FIGS. 21-22 illustrate versions of the stabilized micro chips 250 of FIG. 13 and FIG. 16, respectively. As shown, the tethers 182 can include overlapping layers of a first material layer 186 and a second material layer 188 which overlap to form an interface 187 therebetween, similarly as described with regard to FIGS. 19A-19B. Furthermore, a plurality of contact pads 184 can optionally be formed from either first material layer 186 or second material layer 188, or both.

Figure 23:
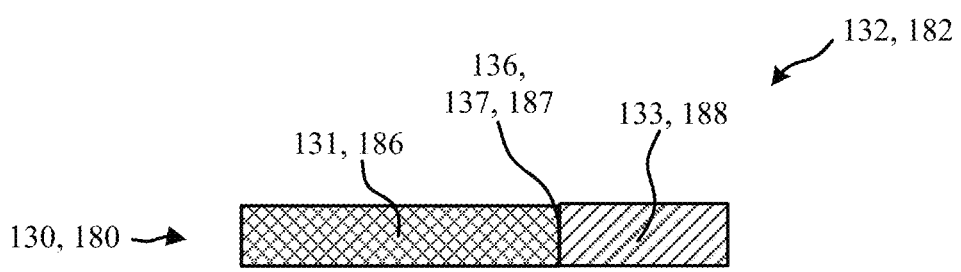
FIG. 23 is schematic cross-sectional side view illustration of a butt joint tether in accordance with an embodiment.

Up until this point tethers 182 have been described as single layer and multiple layer structure including multiple layer stacks, and overlapping layers. In other embodiments, the tethers 182 and the patterned electrically conductive layers 130, 180 can include multiple layers connected with butt joints that can be broken during the transfer sequence to break the tethers. FIG. 23 provides an illustration of an exemplary butt joint that can be formed between a first material layer 131, 186 and second material layer 133, 188. As shown, a butt joint is formed when the lateral face of layers abut or are adjacent to one another. A butt joint can be formed without overlapping, or in addition to overlapping. In such a configuration, the butt joint can be used to provide the breaking location of the tether at a deterministic location along a length of the tether. The butt joint may be between two same materials (e.g. metals) or different materials, such as different metals or a metal and transparent conductive oxide, such as indium tin oxide, for example. Utilization of a butt joint may mitigate residual metal stands that can be associated with fracture, and plastic deformation, when breaking a tether, particularly at smaller micro device sizes where the tether remnants may affect light output. As shown, once fractured, the (lateral) interface 139, 189 between the first material layer 131, 186 and second material layer 133, 188 may correspond to the terminal end 136 of the tether in the integrated product. In an embodiment, the interface 139, 189 may form an intermetallic compound when the first material layer 131, 186 and second material layer 133, 188 are formed of different metallic materials. This may optionally result in a (lateral) surface at the terminal end 136 including a residual of the intermetallic compound in the final integrated product.

Referring now to FIGS. 24A-24E, schematic cross-sectional side view illustrations are provided for a method of transferring an array of LEDs 150 from a donor substrate 100 to a receiving substrate (e.g. display substrate 402) in accordance with an embodiment. It is to be appreciated that while the transfer sequence illustrated in FIGS. 24A-24E is made with regard to the donor substrate 100 of FIGS. 5A-5B, this is exemplary, and the transfer sequence is also applicable to the transfer of other micro devices, including other micro LED and micro chip assemblies described herein.

Figure 24A:
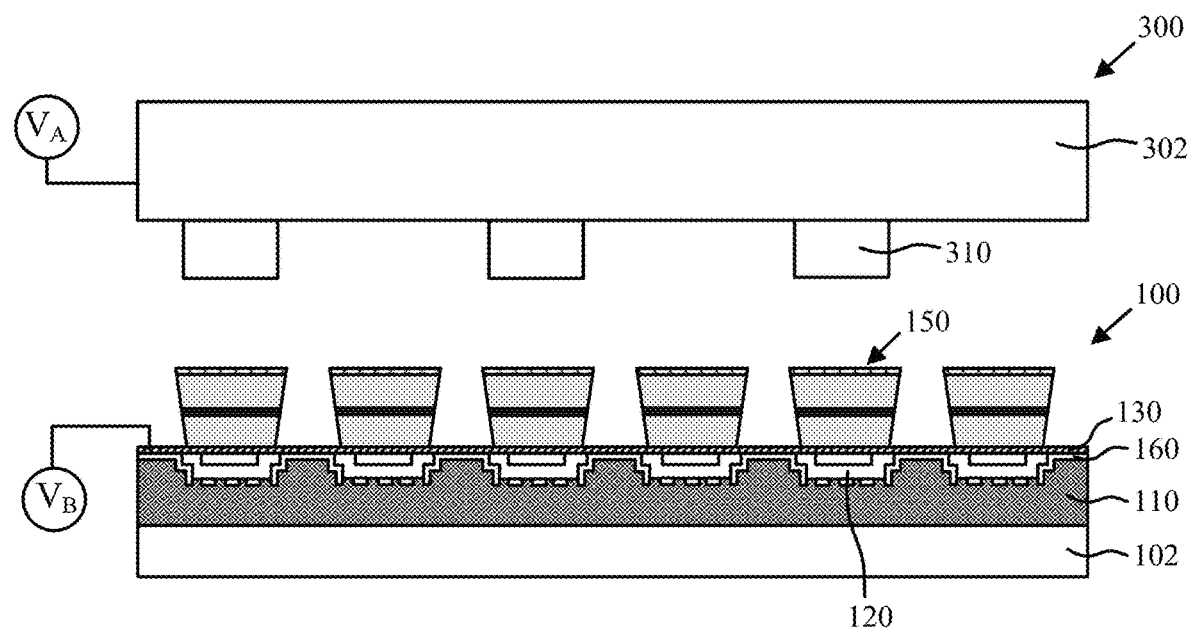
FIGS. 24A-24E are schematic cross-sectional side view illustrations of a method of transferring an array of LEDs from a donor substrate to a receiving substrate in accordance with an embodiment.

FIG. 24A is a cross-sectional side view illustration of a transfer head assembly 300 including an array of micro device transfer heads 310 supported by substrate 302 and positioned over a donor substrate 100 including an array of tethered micro LEDs 150. The micro device transfer heads 310 may operate using a variety of principles including adhesion with elastomeric stamps, electrostatic, etc. Electrostatic micro device transfer heads 310 may include one or more electrodes, e.g. monopolar, bi-polar, multi-polar. In an embodiment, the electrostatic micro device transfer heads 310 are monopolar, and may be connected to a single voltage source VA. In an embodiment, the array of tethered micro LEDs 150 can also be connected to a second voltage source VB. The second voltage source may be connected to either or both the patterned electrically conductive layer 130 and metal layer 160.

Figure 24B:
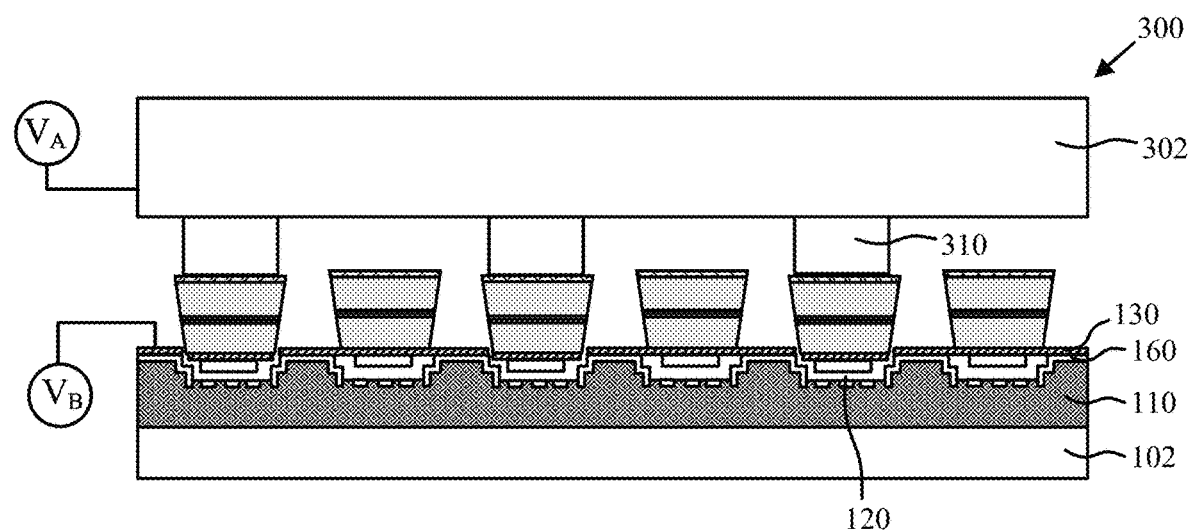

The array of tethered micro LEDs 150 is then contacted with the array of transfer heads 310 as illustrated in FIG. 24B. As illustrated, the pitch of the array of micro device transfer heads 310 is an integer multiple of the pitch of the array of micro LEDs 150. The voltage applied to the array of transfer heads 310 from the first voltage source VA may exert a grip pressure on the micro LEDs 150. Still referring to FIG. 24B, it is illustrated that the micro device transfer heads 310, which exerting a pull-in grip pressure, can also apply a direct pressure to the micro LEDs 150, and optionally push the micro LEDs 150 into the staging cavities and break the tethers 132. Alternatively, the tethers 132 can be broken when picking up the micro LEDs 150. Furthermore, thermal energy (heat), electrical energy (electrical current) or combinations thereof can be applied to the array of micro devices with the array of transfer heads to break the array of tethers 132, optionally in combination with pressure.

Figure 24C:
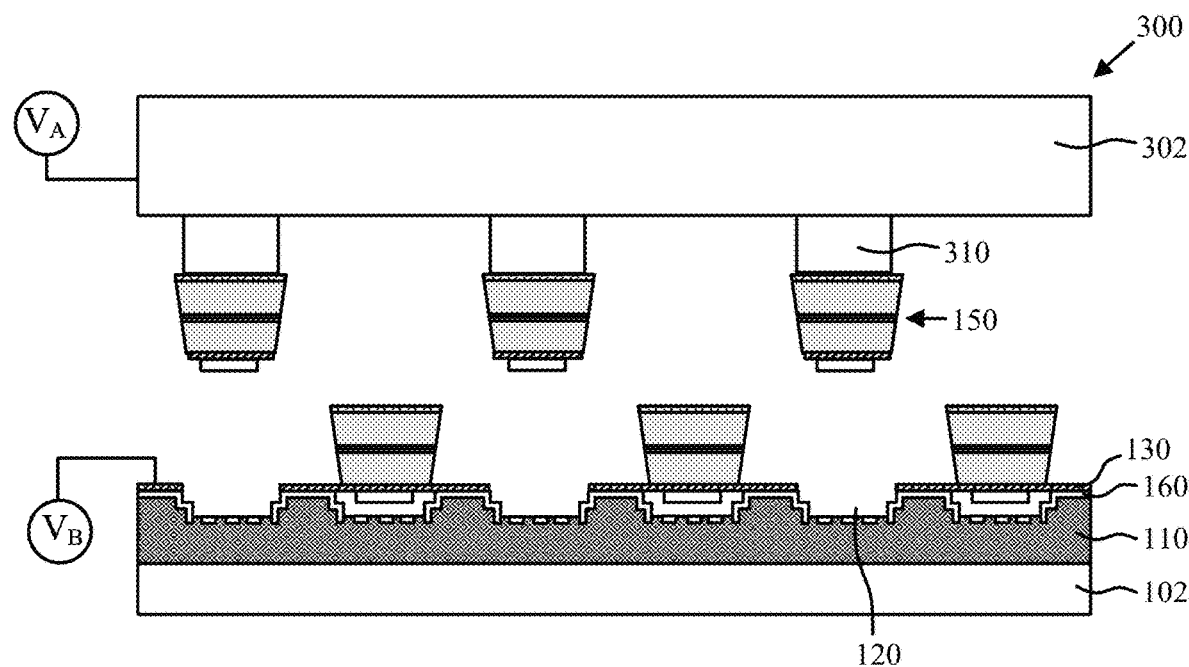
Figure 24D:
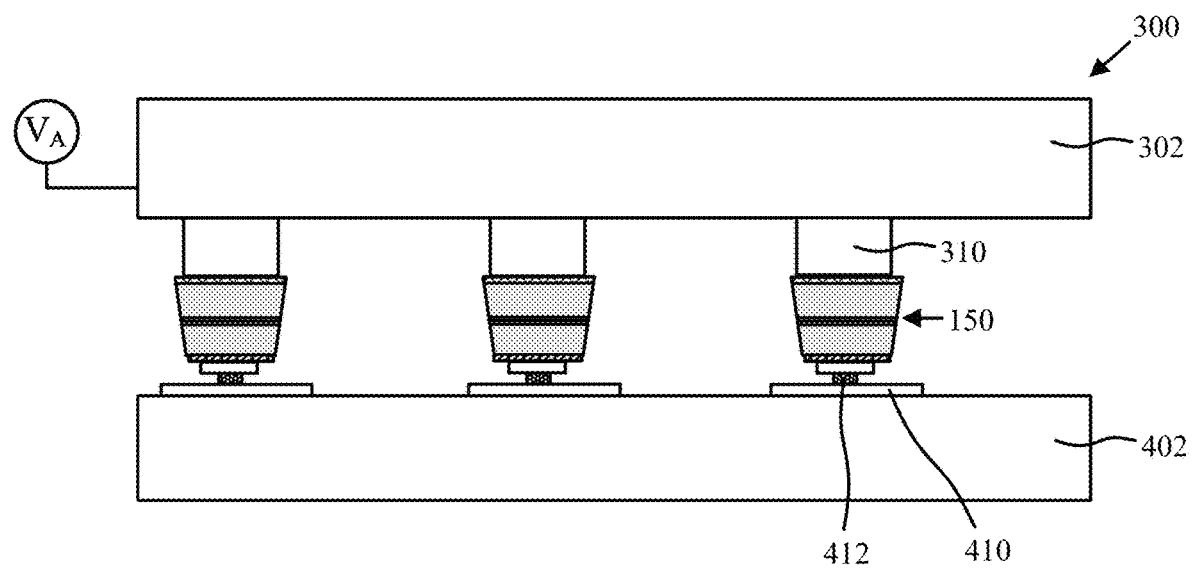
Figure 24E:
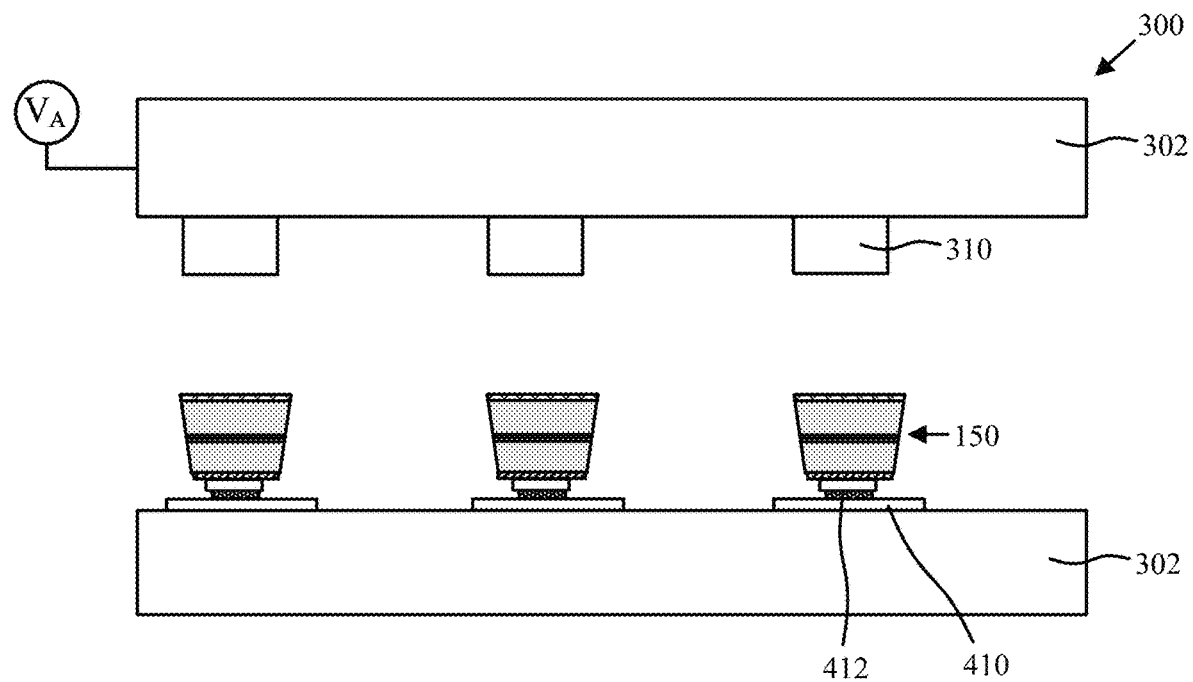

The array of micro LEDs 150 is then picked up with the array of micro device transfer heads 310 as illustrated in FIG. 24C. The array of micro LEDs 150 is then brought into contact with landing pads 410 on display substrate 402 as illustrated in FIG. 24D. This may additionally include bonding the bottom contacts with a bonding layer 412 (e.g. indium, tin, silver) on the landing pads 410. For example, a silver, gold, indium, or tin bonding layer in the bottom contact 152 may be diffused with a silver, gold, indium, or tin bonding layer 412 on the landing pads 410, though other materials may be used. In an embodiment, sufficient diffusion to adhere the array of micro LEDs 150 with the landing pads 410 can be achieved at temperatures of less than 200° C. For example, heat can be applied from a heat source located within the transfer head assembly 300 and/or display substrate 402. The micro LEDs 150 are then released onto the receiving substrate as shown in FIG. 24E. The sequence may then be repeated to transfer additional arrays of micro LEDs.

In an exemplary embodiment, a display structure may include a display substrate 402, a landing pad 410, and a micro LED 150 mounted on the landing pad 410. The micro LED 150 can include a p-n diode 140 and a patterned electrically conductive layer 130 that includes a contact pad 134 and a plurality of tethers 132, which may optionally be attached to the contact pad 134. In some embodiments, the patterned electrically conductive layer 130 is a metallic layer, which may be selected for both electrical and mechanical properties. The tethers 132 in accordance with embodiments may undergo some amount of plastic deformation prior to failure (break) during the transfer sequence. This may result in an increase in grain boundary dislocation density, or other characteristic deformation of that results from critical failure from being placed in tension.

Figure 25:
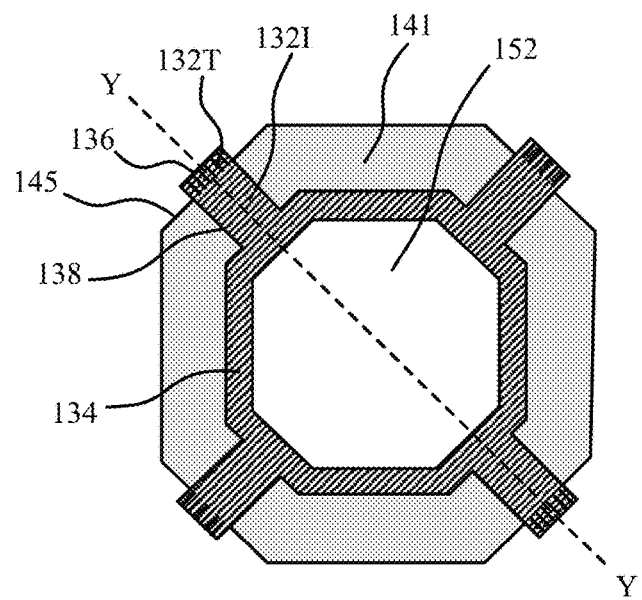
FIG. 25 is a schematic bottom side view illustration of an LED after being removed from a donor substrate in accordance with an embodiment.

FIG. 25 is a schematic bottom side view illustration of a micro LED 150 after being removed from a donor substrate in accordance with an embodiment. For example, the micro LED 150 may be bonded to a display substrate. In particular, the micro LED 150 illustrated in FIG. 25 is substantially similar to that illustrated and describe in FIG. 1B after the tethers 132 have been broken during transfer sequence. As shown, each tether 132 may include an internal region 132I and a terminal region 132T adjacent a terminal end 136 of the tether.

In accordance with some embodiments the terminal end 136 can be a broken terminal end, resulting from fracture during the transfer sequence at a deterministic location along a length of the tether 132. In an embodiment, the terminal region 132T includes a larger grain boundary dislocation density than the internal region 132I. The broken terminal end 136 may also have a more irregular surface profile than the side edges 138 of the tethers. The immediate areas next to the broken terminal end 136 may also have larger grain boundary dislocation density than the immediate areas (e.g. part of internal region 132I) next to the side edges of the tethers. The broken terminal end 136 may also be aligned with or adjacent an edge 145 of the p-n diode 140. The tethers 132 may be designed to have specified fracture locations. In an embodiment where the weight of the micro LEDs 150 and micro device transfer heads is used to provide a downward pressure, the edges of 145 of the p-n diodes 140 may exert a shear force on the tethers 132, which also places the tethers 132 under tension. High stress regions adjacent the p-n diode 140 edges 145 may cause fracture of the tethers 132 in the high stress regions. In an embodiment, the broken terminal ends 136 of the tethers 132 may extend between the edges 145. For example, this may be a result of compliant deformation of the metallic material forming the tethers 132. Additionally, or alternatively thermal energy (heat), electrical energy (electrical current) or combinations thereof can be applied to the array of micro devices with the array of transfer heads to break the array of tethers 132.

In accordance with some embodiments the terminal end 136 can also be a patterned surface, such as those embodiments including peeling of a bi-material tether 132. In an embodiment the terminal region 132T includes a modified top or bottom surface characteristic of peeling from a dissimilar material layer. For example, an intermetallic compound from previous interface 187, 137 may be formed along the surface of the patterned electrically conductive layer in the terminal region 132T. Thus, the intermetallic compound can have a different composition than the bulk of the patterned electrically conductive layer in the terminal region 132T. The terminal region 132T may also be physically deformed as previously described (e.g. irregular surface, larger grain boundary dislocations, etc.) In some embodiments the terminal region 132T includes a step surface (e.g. z-shape) as illustrated in FIG. 19A and FIGS. 21-22 where a second material layer 133, 188 overlaps a first material layer 131, 186, or vice versa. In an embodiment, the underside or topside of a single step of the step surface may include an intermetallic compound, as a result of the overlapping bi-material structure. Alternatively, a step surface may not be present.

It is to be appreciated that while the discussion of the terminal region 132T and broken terminal ends 136 of the tethers is made with regard to the particular embodiment illustrated in FIG. 24, that the concepts are universally applicable to other tethered micro devices, including other micro LEDs 150 and micro chips 250 described herein.

In utilizing the various aspects of the embodiments, it would become apparent to one skilled in the art that combinations or variations of the above embodiments are possible for forming and integrating tethered micro devices. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A display structure comprising:
   a display substrate;
   a landing pad; and
   a micro light emitting diode (LED) mounted on the landing pad, the micro LED including a p-n diode and a patterned electrically conductive layer, the patterned electrically conductive layer including a contact pad and a plurality of tethers that extend from the contact pad.

2. The display structure of claim 1, wherein each tether includes an internal region and a terminal region adjacent a terminal end of the tether.

3. The display structure of claim 2, wherein the terminal region includes a larger grain boundary dislocation density than the internal region.

4. The display structure of claim 2, wherein the terminal region includes an intermetallic compound along a surface of the patterned electrically conductive layer.

5. The display structure of claim 2, wherein the terminal end is adjacent an edge of the p-n diode.

6. The display structure of claim 2, wherein the patterned electrically conductive layer is a metallic layer.

7. The display structure of claim 6, wherein the micro LED includes a metal-stack bottom contact coupled with the contact pad underneath the p-n diode.

8. The display structure of claim 7, wherein the micro LED has a maximum width of less than 10 µm.

9. The structure of claim 2, wherein the patterned electrically conductive layer comprises a material selected from the group consisting of Ni, NiCr, Ru, Au, Cu, Cr, Mo, Ti, and a conductive metal nitride.

10. The display structure of claim 2, wherein the micro LED includes a bottom contact coupled to the contact pad, the bottom contact including a multiple layer stack.

11. The display structure of claim 10, wherein the multiple layer stack includes a reflector layer, a diffusion barrier layer, and a bonding layer.

12. The display structure of claim 10, wherein the bottom contact is underneath the contact pad.

13. The display structure of claim 12, wherein the bottom contact is bonded to the landing pad with a bonding layer.

14. The display structure of claim 2, wherein each tether includes a terminal end that extends between corresponding edges of the micro LED.

15. The display structure of claim 14, the micro LED includes tapered corners.

16. The display structure of claim 2, wherein the contact pad is on a top side of the micro LED, and the micro LED includes a bottom contact.

17. The display structure of claim 16, wherein the bottom contact is bonded to the landing pad with a bonding layer.

18. The display structure of claim 16, wherein the patterned electrically conductive layer is a transparent layer.

19. The display structure of claim 2, wherein each tether includes side edges and a terminal region adjacent a terminal end of the tether, wherein the terminal end has a more irregular surface profile than the side edges.

* * * * *